US011994845B2

(12) United States Patent
Roy et al.

(10) Patent No.: US 11,994,845 B2
(45) Date of Patent: May 28, 2024

(54) DETERMINING A CORRECTION TO A PROCESS

(71) Applicant: ASML NETHERLANDS B.V., Veldhoven (NL)

(72) Inventors: Sarathi Roy, Eindhoven (NL); Edo Maria Hulsebos, Waalre (NL); Roy Werkman, Eindhoven (NL); Junru Ruan, Beaverton, OR (US)

(73) Assignee: ASML NETHERLANDS B.V., Veldhoven (NL)

( * ) Notice: Subject to any disclaimer, the term of this patent is extended or adjusted under 35 U.S.C. 154(b) by 201 days.

(21) Appl. No.: 17/367,901

(22) Filed: Jul. 6, 2021

(65) Prior Publication Data

US 2021/0333785 A1 Oct. 28, 2021

Related U.S. Application Data

(63) Continuation of application No. 17/174,159, filed on Feb. 11, 2021, now Pat. No. 11,086,305, which is a (Continued)

(30) Foreign Application Priority Data

Nov. 7, 2018 (EP) .................................... 18204882
Jan. 9, 2019 (EP) .................................... 19150953
(Continued)

(51) Int. Cl.
*G05B 19/418* (2006.01)
*G03F 7/00* (2006.01)
(Continued)

(52) U.S. Cl.
CPC ... *G05B 19/41875* (2013.01); *G03F 7/70508* (2013.01); *G03F 7/70525* (2013.01);
(Continued)

(58) Field of Classification Search
CPC ............. G03F 7/70508; G03F 7/70525; G05B 13/027; G05B 19/41875; G05B 19/41885;
(Continued)

(56) References Cited

U.S. PATENT DOCUMENTS 6,952,253 B2 10/2005 Lof et al.
11,494,636 B2 11/2022 Jung et al.
(Continued)

FOREIGN PATENT DOCUMENTS

CN 101794325 8/2010
JP 2006013013 1/2006
(Continued)

OTHER PUBLICATIONS

Office Action issued in corresponding Taiwanese Patent Application No. 111134065, dated Apr. 7, 2023.
(Continued)

*Primary Examiner* — Yuhui R Pan
(74) *Attorney, Agent, or Firm* — Pillsbury Winthrop Shaw Pittman, LLP

(57) ABSTRACT

A method for configuring a semiconductor manufacturing process, the method including: obtaining a first value of a first parameter based on measurements associated with a first operation of a process step in the semiconductor manufacturing process and a first sampling scheme; using a recurrent neural network to determine a predicted value of the first parameter based on the first value; and using the predicted value of the first parameter in configuring a subsequent operation of the process step in the semiconductor manufacturing process.

20 Claims, 14 Drawing Sheets

Related U.S. Application Data continuation of application No. PCT/EP2019/077353, filed on Oct. 9, 2019.

(30) Foreign Application Priority Data

May 13, 2019 (EP) .................................... 19173992
Sep. 25, 2019 (EP) .................................... 19199505

(51) Int. Cl.
*G05B 13/02* (2006.01)
*G06N 3/044* (2023.01)

(52) U.S. Cl.
CPC ..... *G05B 13/027* (2013.01); *G05B 19/41885* (2013.01); *G06N 3/044* (2023.01); *G05B 2219/33025* (2013.01); *G05B 2219/45028* (2013.01); *G05B 2219/45031* (2013.01)

(58) Field of Classification Search
CPC ........... G05B 2219/33025; G05B 2219/45028; G05B 2219/45031; G06N 3/0445; Y02P 90/02
See application file for complete search history.

(56) References Cited

U.S. PATENT DOCUMENTS

| | | |
|---|---|---|
| 2003/0054642 A1 | 3/2003 | Kagotani et al. |
| 2003/0223055 A1 | 12/2003 | Agarwal et al. |
| 2004/0207824 A1 | 10/2004 | Lof et al. |
| 2006/0078806 A1 | 4/2006 | Hansen |
| 2006/0170899 A1 | 8/2006 | De Kruif et al. |
| 2009/0063378 A1 | 3/2009 | Izikson |
| 2010/0049680 A1 | 2/2010 | Huang et al. |
| 2012/0208301 A1 | 8/2012 | Izikson et al. |
| 2016/0246185 A1* | 8/2016 | Ypma .................. G03F 7/70525 |
| 2017/0017162 A1 | 1/2017 | Chang et al. |
| 2017/0177997 A1 | 6/2017 | Karlinsky et al. |
| 2017/0193680 A1* | 7/2017 | Zhang ................ G06V 30/2504 |
| 2017/0200265 A1 | 7/2017 | Bhaskar et al. |
| 2017/0357895 A1 | 12/2017 | Karlinsky et al. |
| 2017/0364798 A1 | 12/2017 | Karlinsky et al. |
| 2018/0012180 A1 | 1/2018 | Jones et al. |
| 2018/0067900 A1 | 3/2018 | Mos et al. |
| 2019/0257767 A1 | 8/2019 | Shaubi et al. |
| 2019/0392363 A1 | 12/2019 | Moriwaki et al. |
| 2020/0005139 A1* | 1/2020 | Cherian .................. H01L 22/12 |
| 2020/0104639 A1 | 4/2020 | Didari et al. |
| 2020/0294224 A1 | 9/2020 | Shaubi et al. |

FOREIGN PATENT DOCUMENTS

| | | |
|---|---|---|
| JP | 2006-114901 | 4/2006 |
| JP | 2006179937 | 7/2006 |
| JP | 2009-032183 | 2/2009 |
| JP | 2011233744 | 11/2011 |
| JP | 2017536584 | 12/2017 |
| JP | 2019075555 | 5/2019 |
| JP | 2019102495 | 6/2019 |
| JP | 2002134395 | 5/2022 |
| KR | 10-2018-0061769 | 6/2018 |
| KR | 20190041908 | 4/2019 |
| TW | 201037455 | 10/2010 |
| TW | 201837617 | 10/2018 |
| WO | 2013092106 | 6/2013 |
| WO | 2015049087 | 4/2015 |
| WO | 2020234863 | 11/2020 |

OTHER PUBLICATIONS

Office Action issued in corresponding Korean Patent Application No. 10-2021-7013677, dated Jan. 12, 2023.
Japanese Office Action issued in corresponding Japanese Patent Application No. 2021-524168, dated Oct. 25, 2022.
International Search Report and Written Opinion issued in corresponding PCT Patent Application No. PCT/EP2019/077353, dated Jan. 29, 2020.
Taiwanese Office Action issued in corresponding Taiwanese Patent Application No. 109128463, dated Nov. 4, 2020.
Lin, T, et al.: "A novel key-variable sifting algorithm for virtual metrology", 2008 IEEE International Conference on Robotics and Automation, Pasadena. CA (May 2008).
Su, Y. et al.: "Implementation Considerations of Various Virtual Metrology Algorithms", 2007 IEEE International Conference on Automation Science and Engineering, Scottsdale, AZ, pp. 276-281 2007.
Wang, J. et al. "Bilateral LSTM: A Two-Dimensional Long Short-Term Memory Model With Multiply Memory Units for Short-Term Cycle Time Forecasting in Re-entrant Manufacturing Systems." IEEE Transactions on Industrial Informatics 14, pp. 748-758 (2018).
Levin, T. et al.: "Automated Process Control optimization to control low volume products based on high volume products data", Proc. of SPIE, vol. 5755 (May 17, 2005).
Yahiro, T. et. al.: "Feed-forward alignment correction for advanced overlay process control using a standalone alignment station 'Litho Booster'", Proc. of SPIE, vol. 10585 Mar. 13, 2018.
Yu et al. "Using EWMA control schemes for monitoring wafer quality in negative binomial process," Microelectronics Reliability, vol. 51, pp. 400-405 (2011).
Office Action issued in corresponding Japanese Patent Application No. 2023-077714, dated Apr. 2, 2024.

* cited by examiner

DETERMINING A CORRECTION TO A PROCESS

This application is a continuation of U.S. patent application Ser. No. 17/174,159, filed Feb. 11, 2021, now allowed, which is a continuation of PCT Patent Application No. PCT/EP2019/077353, filed on Oct. 9, 2019, which claims the benefit of priority of European Patent Application No. 18204882.7, filed on Nov. 7, 2018, European Patent Application No. 19150953.8, filed on Jan. 9, 2019, European Patent Application No. 19173992.9, filed on May 13, 2019, and European Patent Application No. 19199505.9, filed on Sep. 25, 2019, each of the foregoing applications is incorporated herein in its entirety by reference.

FIELD

The present description relates to methods of determining a correction to a process, a semiconductor manufacturing processes, a lithographic apparatus, a lithographic cell and associated computer program products.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD = k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

PCT Patent Application Publication No. WO 2015049087, which is incorporated by reference herein in its entirety, discloses a method of obtaining diagnostic information relating to an industrial process. Alignment data or other measurements are made at stages during the performance of the lithographic process to obtain object data representing positional deviation or other parameters measured at points spatially distributed across each wafer. Overlay and alignment residuals typically show patterns across the wafer, known as fingerprints.

In semiconductor manufacture, the Critical Dimension (CD) performance parameter fingerprint can be corrected using a simple control loop. Typically a feedback mechanism controls the average dose per wafer, using the scanner (a type of lithographic apparatus) as an actuator. Similarly, for the overlay performance parameter overlay, fingerprints induced by processing tools can be corrected by adjusting scanner actuators.

Sparse after-develop inspection (ADI) measurements are used as input for a global model used for controlling a scanner (typically run-to-run). Less-frequently measured dense ADI measurements are used for modelling per exposure. Modelling per exposure is performed for fields having large residual, by modelling with higher spatial density using dense data. Corrections that require such a denser metrology sampling cannot be done frequently without adversely affecting throughput.

It is a problem that model parameters based on sparse ADI data typically do not accurately represent densely measured parameter values. This may result from crosstalk that occurs between model parameters and non-captured parts of the fingerprint. Furthermore, the model may be over-dimensioned for such a sparse data set. This introduces a problem that a non-captured fingerprint in run-to-run control is not fully captured by a per-field model. Another problem is erratic sparse-to-dense behavior for distributed sampling, where different wafers (and different lots) have different sampling so that superposing the layouts of many wafers effectively leads to a dense measurement result. There are large residuals between modeled sparse data and densely measured parameter values. This leads to a poor fingerprint description, leading to sub-optimal corrections per exposure.

It is further a problem that for alignment control, only small number of alignment marks can be measured (~40) during exposure without impacting throughput. High-order alignment control requires denser alignment layout and impacts throughput. A solution to this problem, as shown in FIG. 5 is to measure denser alignment marks in an offline tool (Takehisa Yahiro et. al., "Feed-forward alignment correction for advanced overlay process control using a stand-alone alignment station "Litho Booster"," Proc. SPIE 10585, Metrology, Inspection, and Process Control for Microlithography XXXII) and feed forward this high-order correction during exposure, where low-order corrections are still calculated during exposure.

For overlay control, dense overlay measurements can practically be performed only once in several lots (known as higher-order parameter update) to update the high-order correction. The high-order parameters used to determine the scanner control recipe do not change between higher-order parameter update measurements.

SUMMARY

It is desirable to provide a method of determining a correction to a process, that solves one or more of the above-discussed problems or limitations.

Embodiments of the invention are disclosed in the claims and in the detailed description.

In an aspect, there is provided a method for determining a correction to a process, the method comprising:
  obtaining first sparse data representing measured values of a parameter across one or more substrate subject to the process, measured using a sparse sampling layout;
  obtaining dense data representing measured values of the parameter across one or more substrate subject to the process, measured using a dense sampling layout that is more spatially dense than the sparse sampling layout;
  applying a model to the sparse data and dense data to determine a sparse-to-dense mismatch;
  obtaining second sparse data representing measured values of the parameter across the substrate subject to the process, measured using a sparse sampling layout;
  adapting the model based on the sparse-to-dense mismatch;
  applying the adapted model to the second sparse data to determine a sparse model result; and
  determining a correction to the process based on the sparse model result.

In an aspect, there is provided a semiconductor manufacturing process comprising a method for determining a correction to a process according to a method as described herein.

In an aspect, there is provided a lithographic apparatus comprising:
  an illumination system configured to provide a projection beam of radiation;
  a support structure configured to support a patterning device, the patterning device configured to pattern the projection beam according to a desired pattern;
  a substrate table configured to hold a substrate;
  a projection system configured the project the patterned beam onto a target portion of the substrate; and
  a processing unit configured to determine a correction to a process according to a method as described herein.

In an aspect, there is provided a lithographic cell comprising a lithographic apparatus as described herein.

In an aspect, there is provided a computer program product comprising machine readable instructions for causing a general-purpose data processing apparatus to perform the steps of a method as described herein.

It is further desirable to provide a method of modeling parameter data without the requirement of measuring the parameter data densely across a substrate at a high temporal sampling frequency.

In an aspect, there is provided a method to model parameter data, the method comprising: obtaining a set of values of a parameter associated with a plurality of positions on a substrate; obtaining a first matrix of values based on evaluation of one or more base functions at the plurality of positions; obtaining a second matrix of values based on training a matrix of adaptable numbers to previously obtained sets of values of the parameter associated with previous substrates; using the first and second matrix of values and the obtained set of values to determine coefficients of the model; and using the coefficients and second matrix of values to provide modeled values of the parameter.

It is further desirable to provide a method of predicting parameters associated with semiconductor manufacturing processes, reducing the frequency of providing densely measured data while retaining the ability to accurately control the processes.

In an aspect, there is provided s method for configuring a semiconductor manufacturing process, the method comprising: obtaining a first value of a first parameter based on measurements associated with a first operation of a process step in the semiconductor manufacturing process and a first sampling scheme; using a recurrent neural network to determine a predicted value of the first parameter based on the first value; and using the predicted value of the first parameter in configuring a subsequent operation of the process step in the semiconductor manufacturing process.

Preferably, the method further comprises using the predicted value of the first parameter determined based on the first value obtained from measurements at a first operation of a process step in the semiconductor manufacturing process to determine a control recipe of a subsequent operation of the process step in the semiconductor manufacturing process.

In an aspect, there is provided a semiconductor manufacturing process comprising a method for predicting a value of a parameter associated with the semiconductor manufacturing process according to a method as described herein.

In an aspect, there is provided a lithographic apparatus comprising:
  an illumination system configured to provide a projection beam of radiation;
  a support structure configured to support a patterning device, the patterning device configured to pattern the projection beam according to a desired pattern;
  a substrate table configured to hold a substrate;
  a projection system configured the project the patterned beam onto a target portion of the substrate; and
  a processing unit configured to:
    predict a value of a parameter associated with the semiconductor manufacturing process according to a method as described herein.

In an aspect, there is provided a computer program product comprising machine readable instructions for causing a general-purpose data processing apparatus to perform the steps of a method as described herein.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
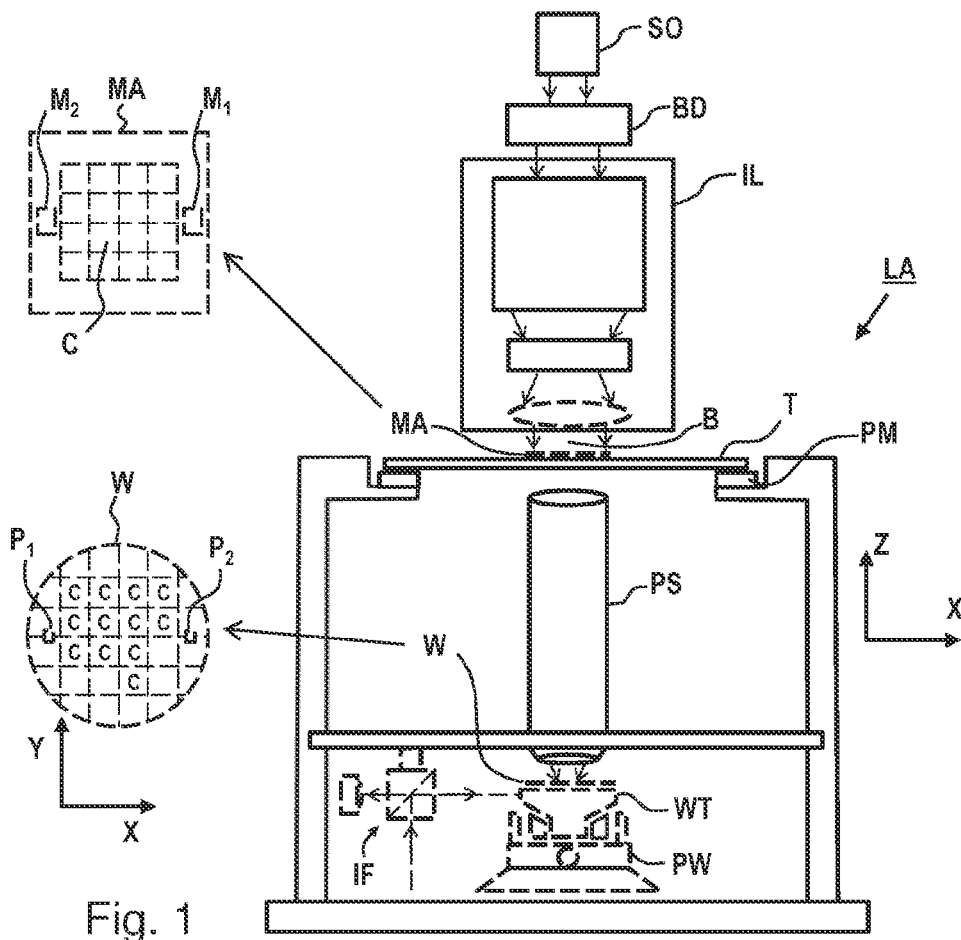
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
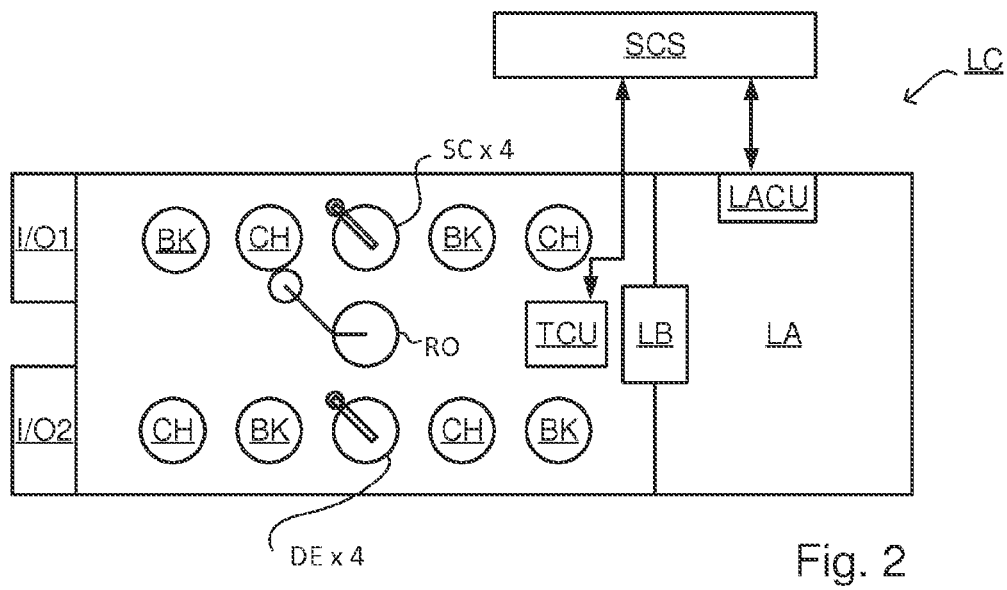
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
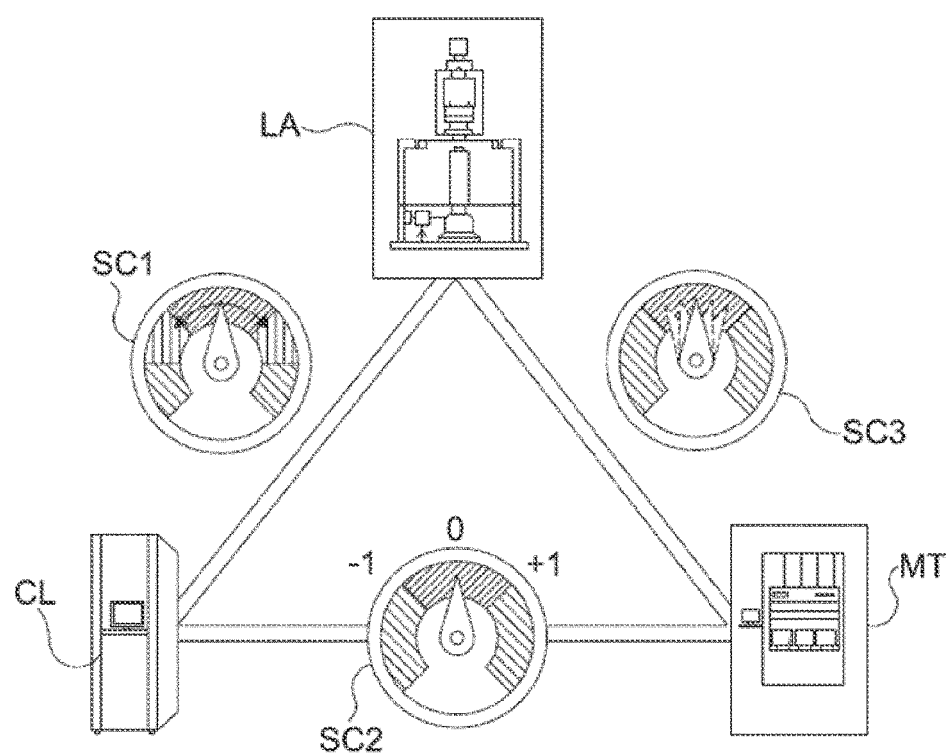
FIG. 3 depicts a schematic representation of holistic lithography, representing a cooperation between three key technologies to optimize semiconductor manufacturing.

Typically, the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

Process Control Using Sparse-to-Dense Mismatch Correction

Figure 4:
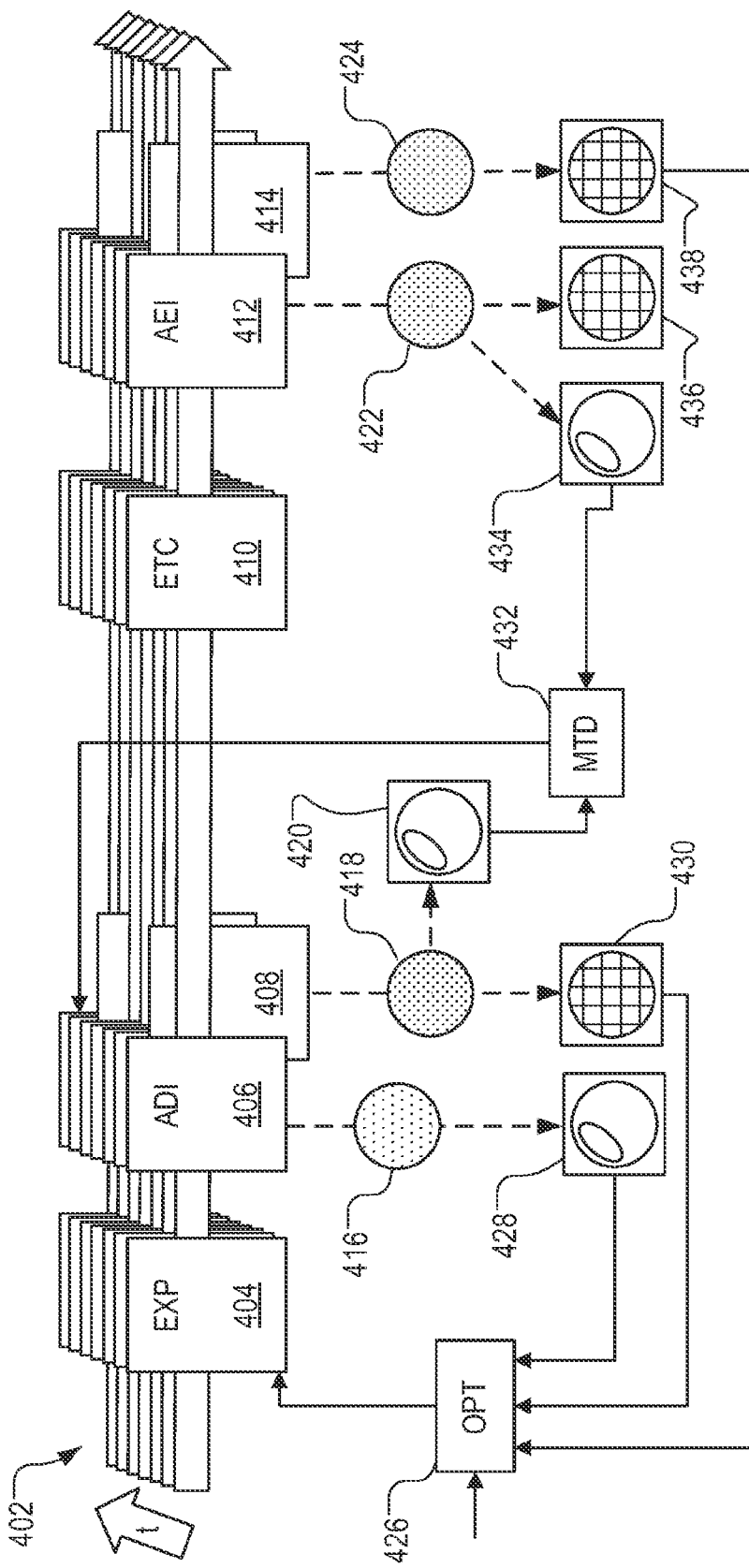
FIG. 4 depicts schematically after-develop and after-etch overlay control of a process.

FIG. 4 depicts schematically after-develop and after-etch overlay control of a process. Feedback control loops run outside the lithographic apparatus. In control loop design, the following parts play a role.

The horizontal arrows 402 represent a substrate's flow through the lithographic process. Several arrows are stacked, representing time, t. Exposure (EXP) 404 is followed by after-develop inspection (ADI) overlay measurements 406, 408. Etch (ETC) 410 is followed by after-etch inspection (AEI) overlay measurements that are dense and sparse 412, and hyper-dense 414. Sparse measurements 406, 412 are used to limit metrology time, with dense measurements 408, 412, 414 being performed less frequently as they require more metrology time. After-develop 406 measurements using a sparse sampling layout are performed to produce sparse ADI data 416 (e.g. <=200 points per wafer). The sparse data is modeled using a certain model (consisting of different sets of parameters; for example Radial Tangential interfield parameters, hyperbolical or exponential edge model or intrafield polynomial model) that describes the process fingerprint 428 in a sufficient manner (fingerprint capture) without introducing too much noise. More parameters mean better fingerprint description, but also more noise.

The sparse model result (process fingerprint) 428 is averaged over lots (for example using an Exponentially Weighted Moving Average) to reduce the impact of lot-to-lot variation and as such can be used, either directly or via a correction optimization step (OPT) 426, to provide stable corrections that can be applied to the exposure 404 of the next lot(s).

The sparse measurement layout is optimized to capture data to the model (reduced normalized model uncertainty) and have uniform spatial coverage. Model uncertainty is typically defined as the relative propagation of measurement error to a modelling (e.g. fitting) error when applying the model to the measurements. A more elaborate explanation of model uncertainty, and more specifically normalized model uncertainty (nMU) (commonly referred to as a G-optimality criterion) is given in paragraph [0170] of U.S. Patent Application Publication No. US2018/0067900, which patent application publication is hereby incorporated by reference in its entirety.

After-etch 412 measurements using a sparse or dense sampling layout produce sparse AEI data 422. These after-etch measurement data 422 are used to derive a global sparse model result 434. The global sparse model result 434 is used to apply a model offset (Metrology To Device, MTD) 432 to the after-develop data, via the ADI measurement steps 406, 408. This optional step may be done so that the control is based on reducing after-etch overlay.

Dense after-develop 408 or hyper-dense after-etch 414 measurements are performed. These measurements are typically not performed for every lot, because of the additionally required metrology effort. The dense data 418 (e.g. 2,000 point per wafer) or hyper-dense data 424 (e.g. 10,000 points per wafer) is used for further modelling of fingerprints associated with individual exposure fields, for example to enable Corrections Per Exposure (CPE) of the overlay fingerprint. A higher-order modelling (typically a per-field model) is performed for this purpose to provide dense model results 436 and hyper-dense model results 438. The assumption is that the higher-order fingerprint may be more stable and as such does not have to be modeled every lot.

To avoid double corrections, the higher order model is determined on the residuals of the lower order model. The lower order model content can be determined on the dense data, which however may lead to a dense-to-sparse mismatch. I.e. the regular lower model determination is on sparse data which might give (only when the lower order model does not capture the fingerprint—which is typically the case) a different result then when modeling on dense data. To correct for this, the dense data may be first downsampled to determine the lower order model content. Thus, modelling-per-exposure is based on the residuals of the sparse subsampled data.

The higher-order (modelling-per-exposure) ADI fingerprint 430 and higher-order (modelling-per-exposure) AEI fingerprint 438 are added (optionally after also being averaged over lots) to the lower-order fingerprint to provide a single correction set via the optimization step (OPT) 426.

The after-etch measurements are of equal or higher density than the after-develop measurements, therefore allowing an even higher order fit.

Additionally or alternatively, the dense data can be collected by means of distributed sampling. Different wafers (and different lots) have different sampling schemes so that superposing the layouts of the sampling schemes of many wafers effectively leads to a dense measurement result. In this case, no separate dense measurement is needed.

There is a sparse-to-dense mismatch problem. The performance of the sparse measurements depends on how well the fingerprint can be described with limited number of sampling points. In case the used model does not fully describe the fingerprint (which is typically the case), then the fingerprint capture will not be as good as when one would use a dense layout.

There is a problem with dense overlay to dense device measurement mismatch. Dense overlay data is not always representative of the overlay between the real product structures on the wafer. The reason being the overlay targets are of inherently different design than product structures and so, have a different response to the optical signals used for metrology. This contributes to metrology to device offset. The inherent noise of metrology device also plays a role in it. If the overlay data can be trained (such as, using electrical measurement as reference) to filter out this offset, a 'cleaner' overlay measurement is possible to control the product overlay.

There is a problem with noise propagation in distributed sampling. This is a form of sparse-to-dense mismatch, but now varying from wafer to wafer, or lot to lot (depending on the type of distribution).

Another problem is that the model used on the sparse data may be over-dimensioned.

Typically a per-field model is used for modelling per exposure (field), which partly will pick-up the sparse-to-dense mismatch, for which it is not designed. A global model could be used, but then the per-field model content is missed. A combination is expensive in terms of metrology need and will show increased noise performance.

Another problem is that modelling per exposure will not capture the higher order content or sparse-to-dense mismatch of each lot.

Dense-to-sparse handling in modelling per exposure in the case of distributed sampling is not optimal except when the same wafers are measured as for the sparse measurement and when the specific sparse layout is used for mismatch handling. A modelling-per-exposure update will in practice not be performed on every lot—even with distributed sampling.

In an embodiment, described below with reference to FIGS. 5 and 6, historical data is used to focus on the sparse-to-dense mismatch to address the abovementioned problems. For example, given a model and sampling layout, the following steps are taken:

From the historical data sparse overlay measurement is used as trainable dataset and dense overlay data is used as reference dataset.

From application of a model, using an automatic algorithm, which part(s) of the model correction parameters is responsible for significant sparse-to-dense mismatch is evaluated. From that knowledge a set of weight factors are derived which make the sparse-to-dense mismatch minimum for this historical dataset. This adapted model is applied to a future dataset.

Figure 5:
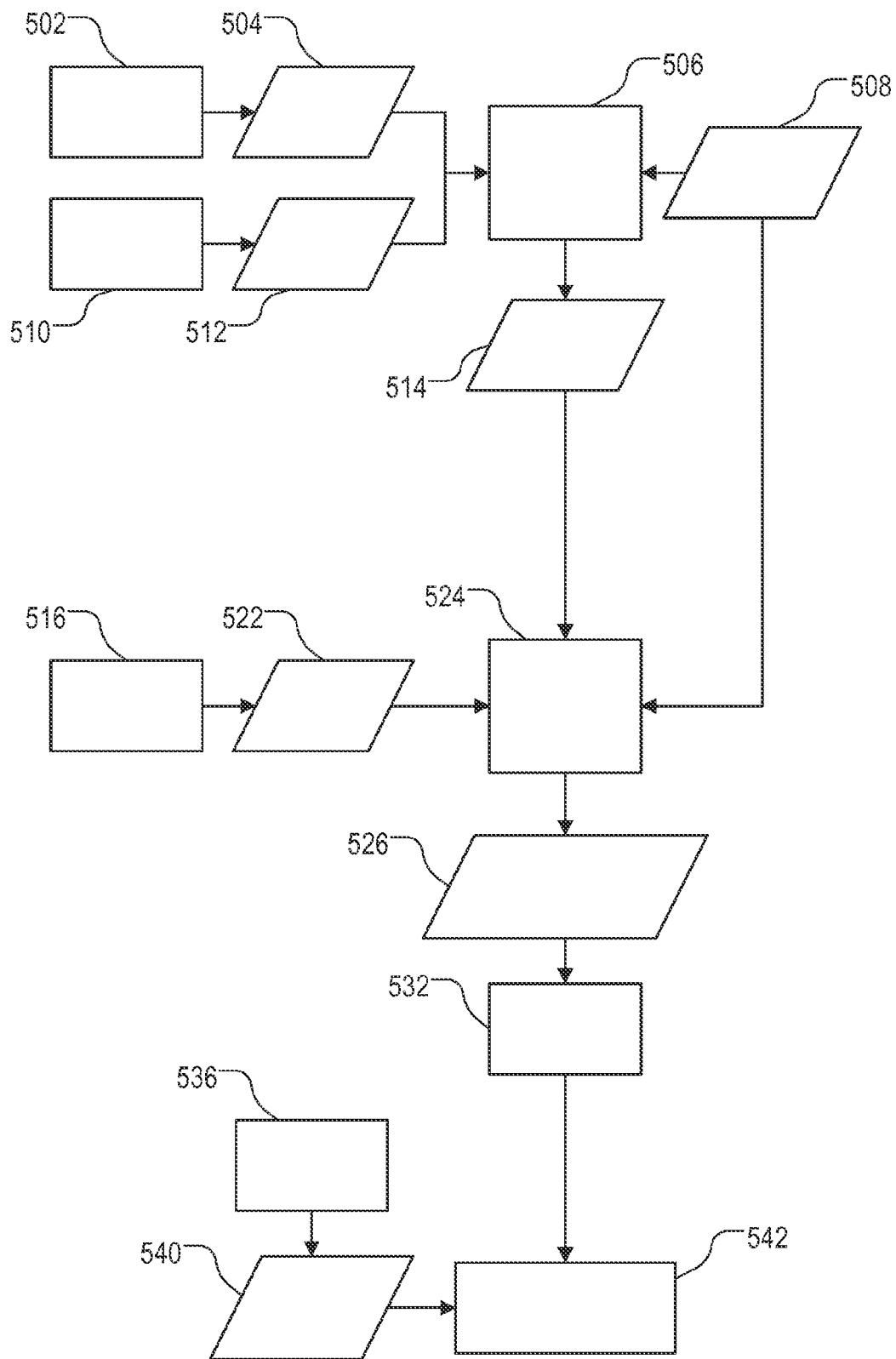
FIG. 5 is a flowchart of a method for determining a correction to a process according to an embodiment.

FIG. 5 is a flowchart of a method for determining a correction to a process according to an embodiment. The method has the steps:

First (historical) sparse data 504 is obtained, representing measured values of a parameter across a substrate subject to the process, measured 502 using a sparse sampling layout. Examples of parameters are overlay, alignment, focus and dose.

Historical dense data 512 is obtained, representing measured values of the parameter across one or more substrate subject to the process, measured 510 using a dense sampling layout that is more spatially dense than the sparse sampling layout.

A model 508 is applied 506 to the sparse data and dense data to determine a sparse-to-dense mismatch.

Second sparse data 522 is obtained representing measured values of the parameter across a substrate subject to the process. The second sparse data 522 is measured 516 using a sparse sampling layout.

The model 508 is adapted 524 based on the sparse-to-dense mismatch. This may be done by evaluating different contributions of respective parts of the model to the sparse-to-dense mismatch. Weighting 514 factors are then determined for weighting the respective parts of the model to reduce, or preferably minimize, the sparse-to-dense mismatch. The model 508 is adapted with the weighting factors 514. Determining the sparse-to-dense mismatch may involve training a matrix on the first sparse data and the dense data. In that case, the step of adapting the model based on the sparse-to-dense mismatch then comprises modifying the second sparse data using the matrix.

The adapted model is applied 524 to the second sparse data 522 to determine a sparse model result 526.

The sparse model result 526 may be averaged 532 over several lots. A correction to the process is determined 542 based on the sparse model result 526.

The correction is then applied to the process to control the process. For example, the scanner setting may be adjusted based on the correction, thus controlling the lithographic process.

After-etch inspection or electrical measurements of semiconductor devices 536 may be used to determine a metrology-to-device (MTD) model offset 540, which is applied with the determined correction 542. When the MTD between overlay and some other measurement is of concern, the other measurement can be taken as reference dense data 512 while the sparse overlay data 504 can itself be trained to it.

Figure 6:
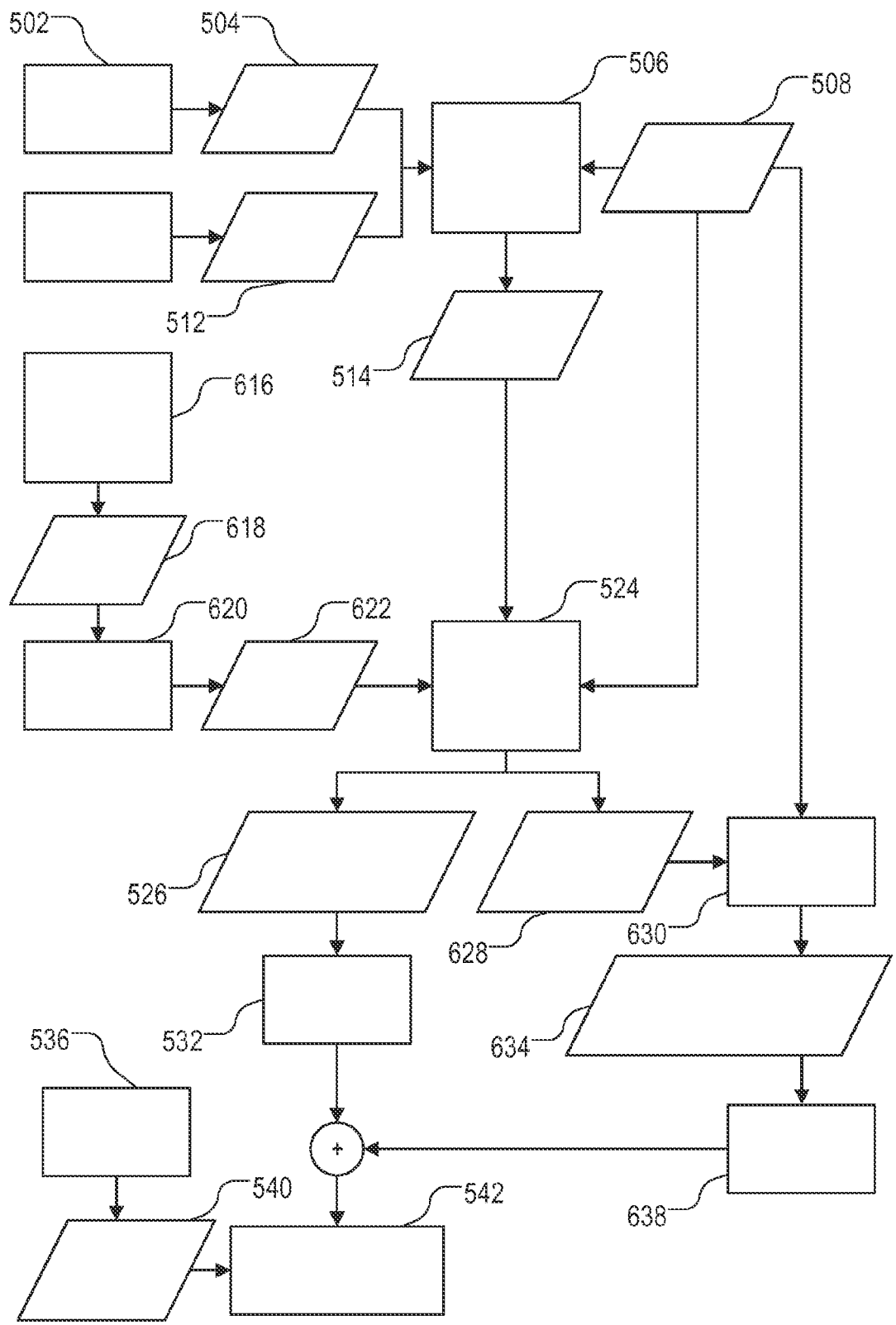
FIG. 6 is a flowchart of a method for determining a correction to a process according to another embodiment using distributed dense sampling.

FIG. 6 is a flowchart of a method for determining a correction to a process according to another embodiment using distributed dense sampling. Features in common with those of FIG. 5 have the same reference numerals. The method has the steps:

First (historical) sparse data 504 is obtained, representing measured values of a parameter across a substrate subject to the process, measured 502 using a sparse sampling layout.

Historical dense data 512 is obtained, representing measured values of the parameter across one or more substrate subject to the process, measured 510 using a dense sampling layout that is more spatially dense than the sparse sampling layout.

A model 508 is applied 506 to the sparse data and dense data to determine a sparse-to-dense mismatch.

Second sparse data 622 is obtained by downsampling 620 second dense data 618 representing measured values of the parameter across a plurality of the substrates subject to the process. The dense data 618 is measured 616 using different sparse sampling layouts distributed over the plurality of substrates.

The model 508 is adapted 524 based on the sparse-to-dense mismatch. This may be done by evaluating different contributions of respective parts of the model to the sparse-to-dense mismatch. Weighting 514 factors are then determined for weighting the respective parts of the model to reduce, or preferably minimize, the sparse-to-dense mismatch. The model 508 is adapted with the weighting factors 514. Determining the sparse-to-dense mismatch may involve training a matrix on the first sparse data and the dense data. In that case, the step of adapting the model based on the sparse-to-dense mismatch then comprises modifying the second sparse data using the matrix.

The adapted model is applied 524 to the second sparse data 622 to determine a sparse model result 526, 628. The sparse model result comprises sparse model residuals 628.

The model 508 is applied 630 to the sparse model residuals 628 to determine a dense model result 634, which is a modelling-per-exposure fingerprint. The dense model result 634 may be averaged 638 over several lots.

The sparse model result 526 may be averaged 532 over several lots. A correction to the process is determined 542 based on the sparse model result 526 and the dense model result 634.

The correction is then applied to the process to control the process. For example, the scanner setting may be adjusted based on the correction, thus controlling the lithographic process.

After-etch inspection or electrical measurements of semiconductor devices 536 may be used to determine a metrology-to-device (MTD) model offset 540, which is applied with the determined correction 542. When the MTD between overlay and some other measurement is of concern, the other measurement can be taken as reference dense data 512 while the sparse overlay data 504 can itself be trained to it.

In embodiments a method is implemented of mapping model parameters associated with fitting sparse parameter data (e.g. sparse ADI overlay, alignment, focus, etc.) to updated model parameters which are better equipped to describe a dense distribution of values of the parameter of interest across the wafer.

For example, a matrix may be trained on historical sparse and dense (ADI/AEI) data, the matrix mapping the sparse model parameters to modified sparse model parameters which are better suited to represent densely measured parameter data.

Using the modified model parameter yields smaller residuals between modeled sparse data and densely measured parameter values leading to better fingerprint description (global and per-field model) leading to more optimal corrections-per-exposure (CPE) corrections.

Figure 7:
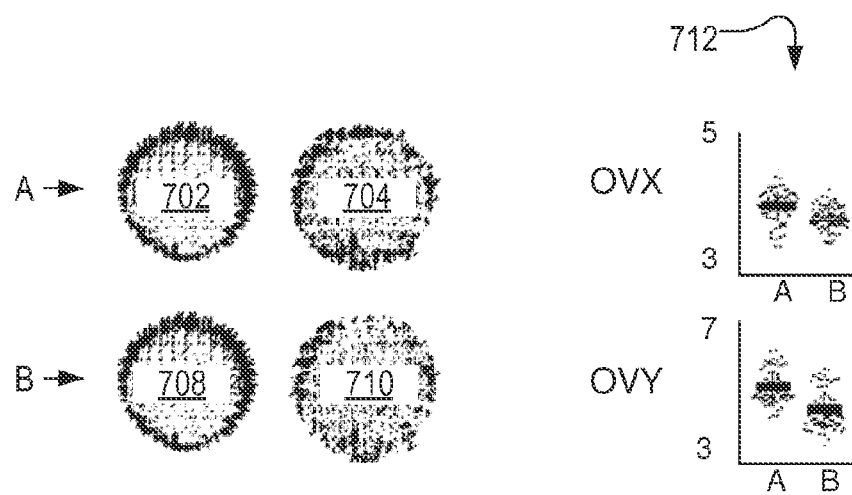
FIG. 7 depicts results of an example comparing the residual overlay performance of a conventional method and an embodiment.

FIG. 7 depicts results of an example comparing the residual overlay performance of a dense layout for a conventional method and an embodiment. The sparse layout contains 200 points where the dense is ~1000 points. Wafer maps 702 to 710 of overlay residuals are shown. Larger residuals are depicted as longer vectors at each point on the wafer. Therefore, darker areas of the wafer maps represent worse residual overlay performance. Using a conventional method (A), decorrected 702 and corrected 704 results are shown. Using a method (B) in accordance with an embodiment described with reference to FIG. 5, decorrected 708 and corrected 710 results are shown. The box plots 712 compare mean 3-sigma overlay (overlay residual) in the x-direction (OVX) and y-direction (OVY) in nm, for the conventional method (A) and the embodiment (B). The embodiment (B) has lower overlay residual than the conventional method (A). This illustrates the advantage of the embodiment.

Figure 8:
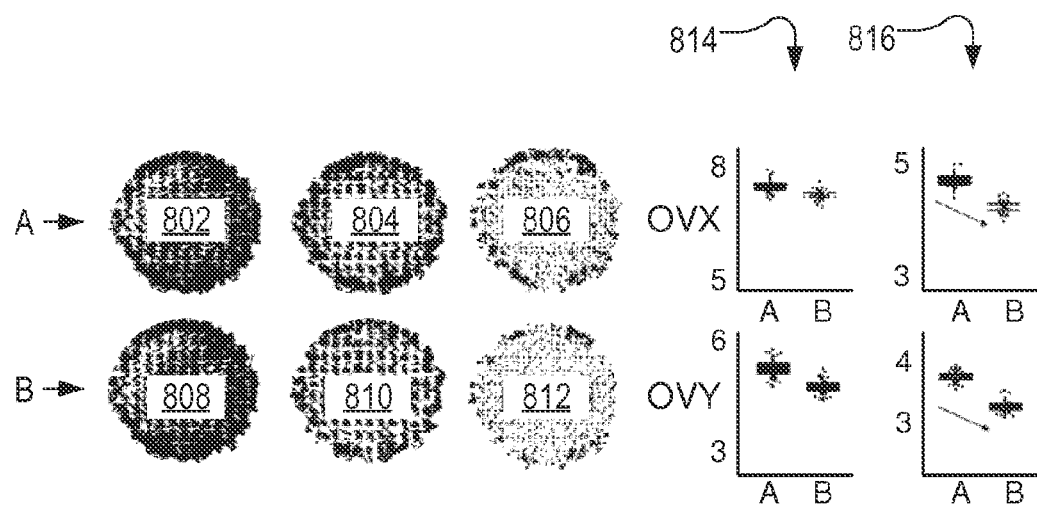
FIG. 8 depicts results of an example comparison, like for FIG. 7, but for distributed sampling.

FIG. 8 depicts results of an example for distributed sampling. The distributed layout uses a 12-wafer cycle over 200 points in each different sparse layout to provide a dense layout (~2000 points). Wafer maps 802 to 812 of overlay residuals are shown, as for FIG. 7. Using a conventional method (A), decorrected 802 and corrected 804, 806 results are shown. Using a method (B) in accordance with an embodiment described with reference to FIG. 6, decorrected 808 and corrected 810, 812 results are shown. The modeling is done in two steps; at a global level 804, 810 and from global residuals for a corrections-per-exposure (CPE) model (modelling-per-exposure level) 806, 812.

The box plots 814 compare mean 3-sigma overlay (overlay residual) in the x-direction (OVX) and y-direction (OVY) in nm, for the conventional method (A) and the embodiment (B) at the global level (step 1). The embodiment (B) has lower overlay residual than the conventional method (A).

The box plots 816 compare mean 3-sigma overlay (overlay residual) in the x-direction (OVX) and y-direction (OVY) in nm, for the conventional method (A) and the embodiment (B) at the modelling-per-exposure level (step 2). The embodiment (B) has lower overlay residual than the conventional method (A). The noise suppression with the embodiment (B) helps at the global level 814 already, so the cumulative effect makes the modelling-per-exposure correction even more noise-free at the modelling-per-exposure level 816.

Embodiments may be implemented in a semiconductor manufacturing process comprising a method for determining a correction to the process according to the embodiments described herein.

Embodiments may be implemented in a lithographic apparatus or lithographic cell as described with reference to FIGS. 1 and 2.

Embodiments may be implemented in a computer program product comprising machine readable instructions for causing a general-purpose data processing apparatus (such as LACU in FIG. 2) to perform the steps of a method as described herein.

Embodiments actively adapt the overlay model with respect to historical data, suppressing noise from it. Information gathering from historical dataset is used to know more about the interplay of metrology data and model/sampling. Two-step noise suppression in distributed sampling is also provided by embodiments.

If we observe the training result, and determine which parameters are becoming more important and which are becoming irrelevant, we may understand which process tool is malfunctioning and then actively improve the control flow (such as increase the modelling-per-exposure frequency, etc.)

As mentioned above, typically a per-field model is used for modelling per exposure, which partly will pick-up the sparse-to-dense mismatch, for which it is not designed. Embodiments reduce the noise impact for per-field model, which may result in modelling-per-exposure updates with fewer measured points.

Overall, embodiments provide improved process control resulting in process yield performance gain.

Further embodiments relating to aspects of the invention as described so far are disclosed in the list of numbered clauses below:

1. A method for determining a correction to a process, the method comprising:
    obtaining first sparse data representing measured values of a parameter across one or more substrate subject to the process, measured using a sparse sampling layout;
    obtaining dense data representing measured values of the parameter across one or more substrate subject to the process, measured using a dense sampling layout that is more spatially dense than the sparse sampling layout;
    applying a model to the sparse data and dense data to determine a sparse-to-dense mismatch;
    obtaining second sparse data representing measured values of the parameter across the substrate subject to the process, measured using a sparse sampling layout;
    adapting the model based on the sparse-to-dense mismatch;
    applying the adapted model to the second sparse data to determine a sparse model result; and
    determining a correction to the process based on the sparse model result.
2. The method of clause 1, wherein the step of adapting the model based on the sparse-to-dense mismatch comprises:
    evaluating different contributions of respective parts of the model to the sparse-to-dense mismatch;
    determining weighting factors for weighting the respective parts of the model to reduce the sparse-to-dense mismatch; and
    adapting the model with the weighting factors.
3. The method of clause 2, wherein the step of determining weighting factors comprises:
    determining weighting factors for weighting the respective parts of the model to minimize the sparse-to-dense mismatch.
4. The method of any preceding clause wherein determining the sparse-to-dense mismatch comprises training a matrix on the first sparse data and the dense data, and the step of adapting the model based on the sparse-to-dense mismatch comprises modifying the second sparse data using the matrix.
5. The method of any preceding clause, wherein:
    the step of obtaining second sparse data comprises obtaining second sparse data by downsampling second dense data representing measured values of the parameter across a plurality of the substrates subject to the process, the dense data measured using different sparse sampling layouts distributed over the plurality of substrates;
    the sparse model result comprises sparse model residuals;
    the method further comprises applying the model to the sparse model residuals to determine a dense model result; and
    the step of determining a correction to the process is further based on the dense model result.
6. A semiconductor manufacturing process comprising a method for determining a correction to the process according to the method of any preceding clause.
7. A lithographic apparatus comprising:
    an illumination system configured to provide a projection beam of radiation;
    a support structure configured to support a patterning device, the patterning device configured to pattern the projection beam according to a desired pattern;
    a substrate table configured to hold a substrate;
    a projection system configured the project the patterned beam onto a target portion of the substrate; and
    a processing unit configured to determine a correction to a process according to the method of any of clauses 1 to 5.
8. A lithographic cell comprising the lithographic apparatus of clause 7.
9. A computer program product comprising machine readable instructions for causing a general-purpose data processing apparatus to perform the steps of a method according to any of clauses 1 to 5.

Machine Learning Based Augmentation of Sparsely Measured Parameter Data

In another aspect, a model is trained based on dense measurement data. A typical model comprises model coefficients and base functions, wherein the model coefficients are associated with the base functions. The base functions can be evaluated on the co-ordinates on the measurement grid of interest and subsequently be multiplied with the model coefficients in order to obtain one or more modeled values for a parameter of interest (e.g. overlay or the like).

Figure 9:
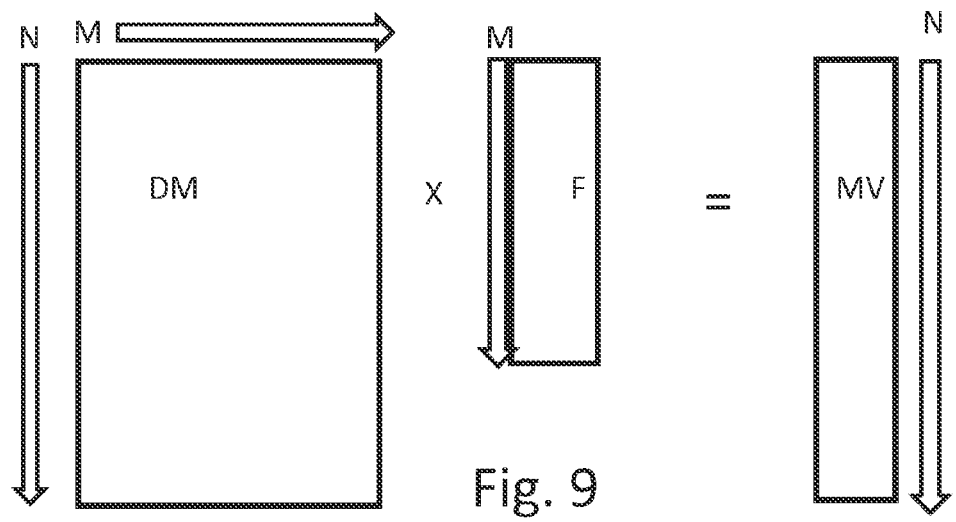
FIG. 9 depicts a method of modelling measured parameter data.

Usage of the model is traditionally implemented by construction of a design matrix comprising a matrix DM of size N*M comprising N values for each base function out of the M base functions obtained by determining the value of each base function 1 . . . M at each co-ordinate 1 . . . N. The co-ordinates are normally associated with the co-ordinates for which a measurement value of a parameter (overlay, alignment, CD or any other performance or process parameter) is available. Multiplying the design matrix DM with a column vector F of fitting coefficients f1 . . . fM yields a column vector MV of values being close to the originally measured values of the parameter of interest. This is depicted in FIG. 9. Mathematically the task of determining the fitting coefficients based on a vector of available measurement data is then: DM*F=MV, which can be transformed to: F=(DM)^-1*MV. Further reference is made to PCT Patent Application Publication No. WO2013092106A1, in particular paragraph [0387]-[0394] which explain the method of defining a design matrix and determining a sampling scheme tailored to minimize a model uncertainty associated with that sampling scheme.

The base functions as utilized must be representative of the typical spatial behavior of the values of the parameter of interest (for example across a substrate, a field on the substrate, or even a region within the field (sub-field)). When for example an overlay fingerprint across a substrate is typically limited to six order polynomial order, the utilized base functions must not extend to $10^{th}$ order polynomials as this may lead to overfitting behavior. However the reverse may also be the case; in case the parameter values are expected to demonstrate high order behavior, the base functions need to extent to sufficiently high order in order to model the measurement data with sufficiently high accuracy. In the latter case the measurement data must be available with sufficiently high density to prevent that underfitting takes place; typically observed as non-physical fitting artefacts such as high amplitude and high order fluctuations of modeled parameter values. Hence a disadvantage of state of the art modeling methods is the requirement that the selected model (e.g. selected set of base functions) needs to be compatible with spatial variations actually occurring during a potentially long period of time. This may require temporally frequent and spatially dense measurement of the parameter (values) in order to guarantee that the modeled values represent the actual parameter fingerprint behavior. However in a high volume manufacturing environment there is seldom opportunity to meet this requirement as this would impact the throughput of the manufacturing process negatively.

Hence a modeling method is needed that ensures highly accurate modeling of all actually occurring spatial components comprised within measurement data of the parameter of interest, while requiring training on dense measurement data, but being deployed on frequently measured sparse measurement data.

Figure 10:
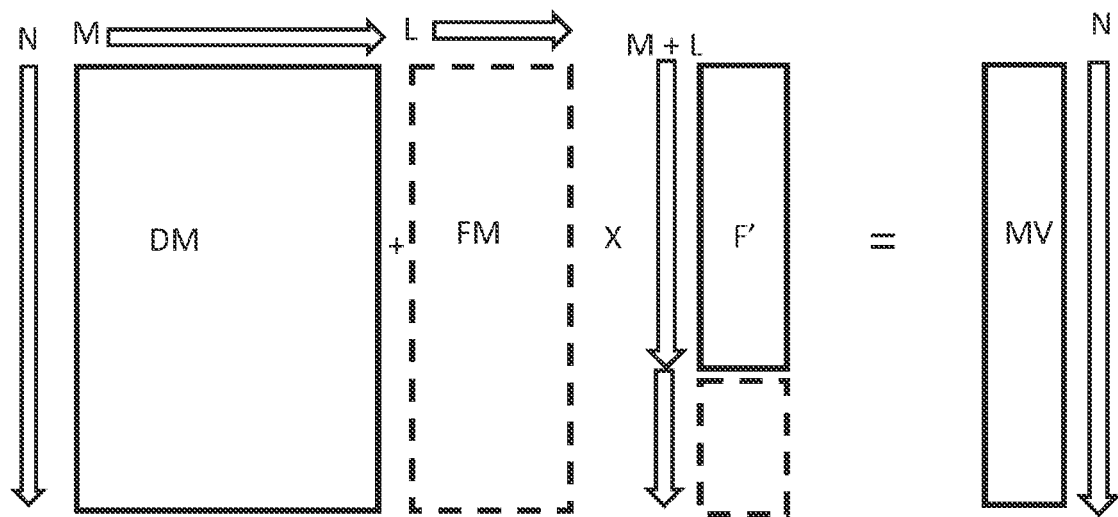
FIG. 10 depicts a method of modelling measured parameter data according to an embodiment.

It is proposed to extend the state of the art modeling method by so-called free-form parameters which are not associated with base functions, but are trained in addition to the evaluation of the design matrix on dense measurement data. The method is depicted in FIG. 10. The freeform parameters are laid out as a freeform matrix FM of dimension N*L, with L the number of freeform coefficients associated with the freeform matrix FM and the values of the freeform matrix being (dynamically) adaptable numbers. The fitting coefficient column vector F' now comprises the fitting coefficients associated with the base functions and also L freeform fit coefficients. The fitting coefficients associated with the base functions may be determined based on the previously defined matrix equation (F=(DM^-1)*MV), while the freeform parameters may be tuned to improve the quality of the modeled parameter values (e.g. for example based on similarity to the measured values M). The freeform parameters and freeform coefficient may for example be determined by using a gradient descent method applied to the matrix equation F'=((DM+FM)^-1)*MV. The main result being obtaining an optimized set of freeform parameters and freeform coefficients.

The freeform parameters may be obtained by machine learning methods using data sets of densely measured parameter values. In this case the freeform parameters are considered to be features which correlate to observed parameter values (measurements). The training aspect ensures that the model (in particular the trained freeform fit coefficients) accurately represent the higher order behavior of the measurement data. The lower order behavior is typically fetched accurately by modeling frequently measured sparse data using lower order base functions and fitting coefficients associated with these base functions. The high order content of the modelled measurement data is then mainly provided by the trained freeform parameters and freeform fitting coefficients. Utilizing the modeling method it is not needed to frequently provide dense measurement data as the model itself provides higher order content (prediction), without being dependent on a certain minimum required density of the data.

In an embodiment, a method is provided to model parameter data, the method comprising: obtaining values of a parameter associated with a plurality of positions on a substrate; providing a first matrix of values based on evaluation of one or more base functions at the plurality of positions and a second matrix of values based on training a matrix of adaptable numbers to previously obtained sets of values of the parameter associated with previous substrates; aggregating the first and second set of values; using the aggregated set and the obtained values of the parameter to determine coefficients of the model; and using the coefficients and second matrix of values to provide modeled values of the parameter.

In an embodiment the parameter is overlay.

In an embodiment the plurality of positions is associated with a sparse measurement scheme across one or more substrates, the one or more substrates being for example wafers processed in a semiconductor manufacturing process.

In an embodiment the base functions are polynomials.

In an embodiment the base functions are mutually orthogonal.

In an embodiment the base functions are at most of $6^{th}$ order across the substrate.

In an embodiment the plurality of positions relate to an exposure field on a wafer.

In an embodiment the model parameters are freeform model parameters.

In an embodiment the trained relationship is obtained based on initial values of the parameter across one or more densely sampled previous substrates.

In an embodiment the trained relationship is based on using a machine learning method, such as a neural network, to establish relations between the individual model parameters and a fingerprint of the parameter across one or more substrates.

In an embodiment the fingerprint of the parameter comprises higher order components.

In an embodiment the higher order components relate to sample point specific values of the parameter.

Alternatively the modeling of the measurement data may be entirely based on freeform model parameters and freeform coefficients. In this case the method of modeling parameter data according to an embodiment comprises: obtaining a set of values of a parameter associated with a plurality of positions on a substrate; and using the set of values as an input to a machine learning model trained to map one or more values of the parameter to a predicted value of the parameter to obtain a modeled value of the parameter. In this case the values of the parameter associated with various positions on the substrate are considered to be features that can be mapped to (modeled) values of the parameter at the positions. For example, the machine learning model may be a neural network having weights and biases optimized to map the obtained values to modeled values. The training may be based on defining a matrix of N*M freeform parameters and M freeform coefficients associated with the machine learning model, wherein N the number of positions on the substrate and determining the M freeform coefficients of the machine learning model based on optimizing a similarity between the N predicted values of the parameter and measured values of the parameter. Using the determined M freeform coefficient and the N*M freeform parameters N modeled values of the parameter may be determined.

Further embodiments of the invention are disclosed in the list of numbered clauses below:

10. A method to model parameter data, the method comprising:
    obtaining a set of values of a parameter associated with a plurality of positions on a substrate;
    obtaining a first matrix of values based on evaluation of one or more base functions at the plurality of positions;
    obtaining a second matrix of values based on training a matrix of adaptable numbers to previously obtained sets of values of the parameter associated with previous substrates;
    using the first and second matrix of values and the obtained set of values to determine coefficients of the model; and
    using the coefficients and second matrix of values to provide modeled values of the parameter.
11. A method according to clause 10, wherein the parameter is overlay.
12. A method according to clause 10 or clause 11, wherein the plurality of positions is associated with a sparse measurement scheme across one or more substrates being subject to a semiconductor manufacturing process.
13. A method according to any of clauses 10 to 12, wherein the base functions are polynomials.
14. A method according to any of clauses 10 to 13, wherein the base functions are mutually orthogonal.
15. A method according to clause 13, wherein the base functions are at most of $6^{th}$ order across the substrate.
16. A method according to any of clauses 10 to 15, wherein the plurality of positions relate to an exposure field on the substrate.
17. A method according to any of clauses 10 to 16, wherein the adaptable numbers are freeform model parameters.
18. A method according to any of clauses 10 to 17, wherein the previously obtained sets of values of the parameter are associated with densely measured previous substrates.
19. A method according to any of clauses 10 to 18, wherein the training is based on using a machine learning method, such as a neural network, to establish relations between the adaptable numbers and a fingerprint of the parameter across each individual substrate out of the previous substrates.
20. A method according to clause 19, wherein the fingerprint of the parameter comprises higher order components.
21. A method according to clause 20, wherein the higher order components relate to sample point specific values of the parameter.
22. A computer program product comprising machine readable instructions for causing a general-purpose data processing apparatus to perform the method of any of clauses 10 to 21.

Recurrent Neural Networks Used in Prediction of High Order Fingerprints

Figure 11:
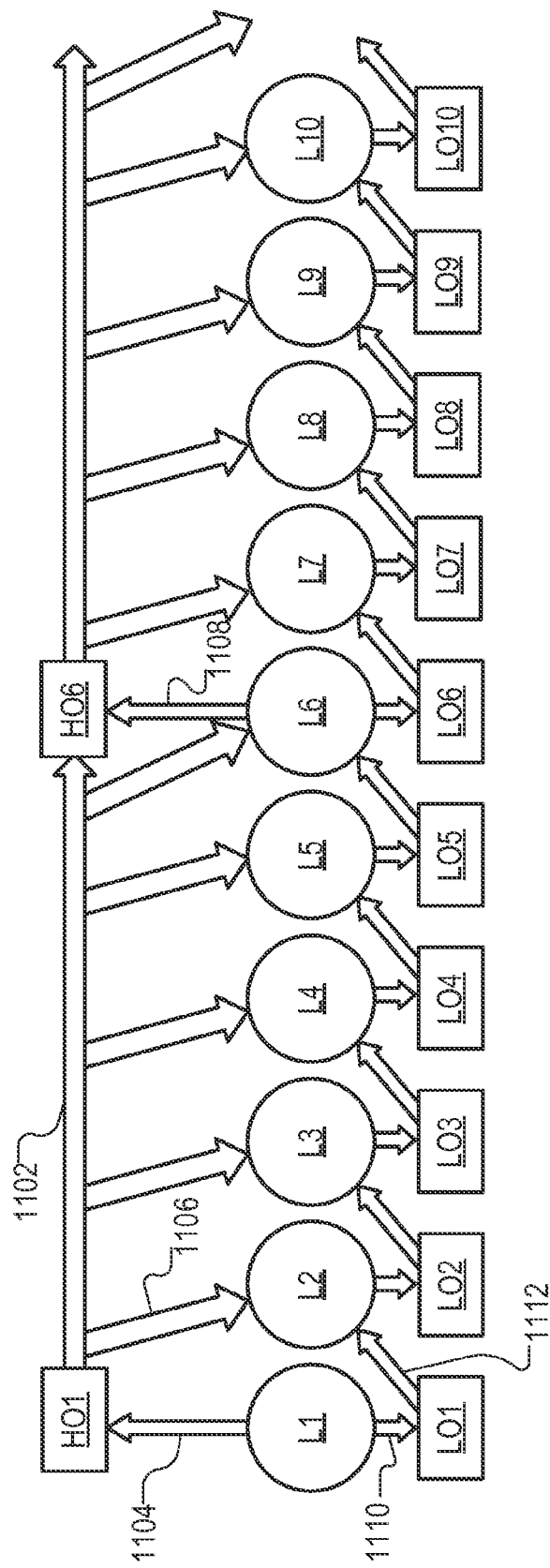
FIG. 11 depicts a schematic overview of overlay sampling and control of a semiconductor manufacturing process.

FIG. 11 depicts a schematic overview of overlay sampling and control of a semiconductor manufacturing process. With reference to FIG. 11, a sequence of ten operations L1 to L10 of an exposure process step on ten wafer lots (or batches, or wafers) are shown. A value of a high-order overlay parameter HO1 is obtained based on measurements 1104 of the first lot L1 using a spatially dense sampling scheme. The high-order overlay parameter HO1 is used to configure the semiconductor manufacturing process, for example by determining control recipes 1106 for subsequent exposures L2 to L6 of the next five lots. Then, an updated value of the high-order overlay parameter HO6 is obtained based on the earlier 1102 high-order overlay parameter HO1 and based on measurements 1108 of the sixth lot L6 using the spatially dense sampling scheme. In this example the higher-order parameter update repeats at the exposure of every fifth lot.

Meanwhile, for the exposure of every lot, low-order corrections are calculated per lot from sparse measurements. For example, at the exposure of lot L1 a low-order overlay parameter LO1 is obtained based on measurements 1110 using a sparse sampling scheme, which is less spatially dense and more frequent than the spatially dense sampling scheme. The low-order parameter LO1 is used to configure the semiconductor manufacturing process, for example by determining the control recipe 1112 of the subsequent operation L2 of the exposure step, and so on.

Thus, the low-order corrections are calculated per lot from sparse measurements, and high-order corrections are obtained from dense measurements once in several lots.

Figure 12:
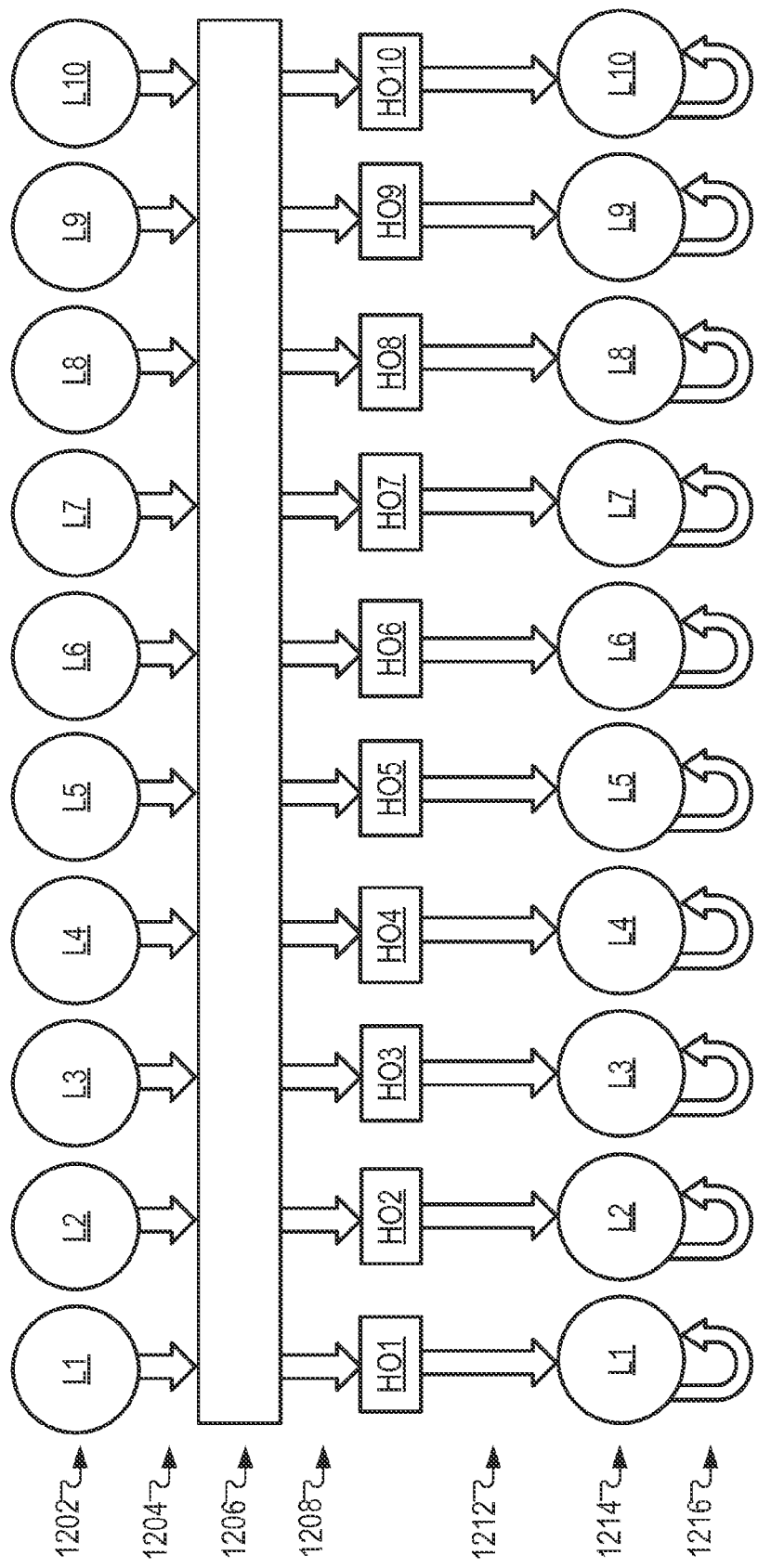
FIG. 12 depicts a schematic overview of known alignment sampling and control of a semiconductor manufacturing process.

FIG. 12 depicts a schematic overview of alignment sampling and control of a semiconductor manufacturing process. With reference to FIG. 12, wafer lots L1 to L10 have an off-line alignment mark measurement step 1202. The measurements 1204 are performed by an off-line measurement tool, 1206, which is optimized for off-line measurements with a high spatial sampling density. The measured high-order alignment parameter values 1208 are stored HO1 to HO10 for each wafer lot L1 to L10. Then each high-order alignment parameter value is used to determine a control recipe 1212 of the operation of an exposure step 1214 on the corresponding wafer lot L1 to L10.

Meanwhile, for the exposure of every lot, low-order corrections are calculated per lot from sparse measurements. For example, at the exposure 1214 of lot L1, a low-order alignment parameter 1216 is obtained based on measurements using a sparse sampling scheme, which is less spatially dense than the spatially dense sampling scheme. It has the same frequency (per lot) as the offline dense measurements 1204 of the high-order alignment parameters. The low-order parameter 1216 is used to determine the control recipe of the operation L1 of the same exposure step.

Embodiments use a strategy for updating both overlay and alignment measurements in-between dense measurements using a Long Short-Term Memory (LSTM) prediction algorithm. This improves the performance of alignment and overlay control with minimum impact on throughput. A completely independent LSTM network prediction (no dense measurement required after training) is also possible, however it may diverge after some time if the learning becomes inadequate.

Figure 13:
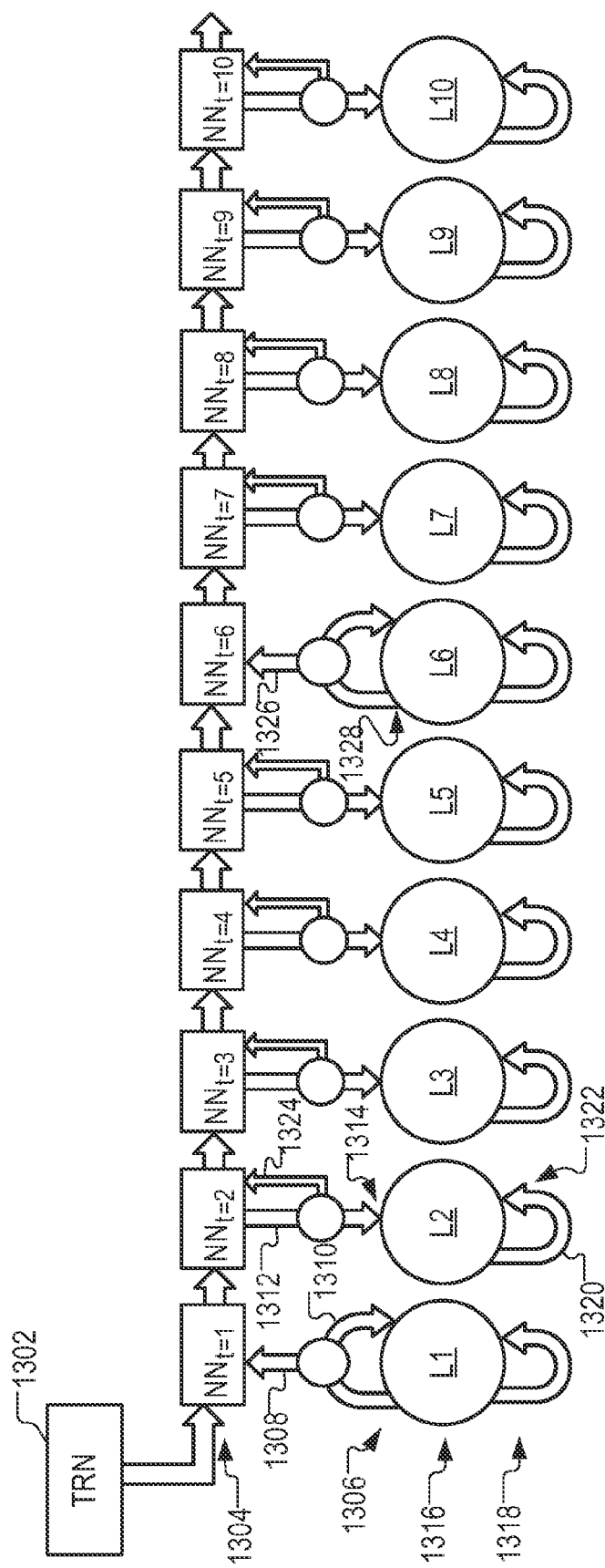
FIG. 13 depicts a schematic overview of a method of sampling and control of a semiconductor manufacturing process in accordance with an embodiment of the present invention.

FIG. 13 depicts a schematic overview of a method of sampling and control of a semiconductor manufacturing process in accordance with an embodiment of the present invention.

With reference to FIG. 13, updating of high-order parameters is achieved with prediction in in-between lots/wafers using a LSTM neural network. This provides improved high-order correction for both alignment and overlay. The low-order corrections are measured per wafer, while the high-order corrections are predicted with LSTM in in-between lots/wafers. The neural network is configured with an initial training (TRN) step 1302.

FIG. 13 depicts a method for predicting a value of a high-order parameter associated with a semiconductor manufacturing process. In this example, the semiconductor manufacturing processes a lithographic exposure process. The parameter is the third-order scanner exposure magnification parameter in the y-direction, D3y. The method involves obtaining a value 1308 of the high-order parameter based on measurements 1306 using a spatially dense sampling scheme. A recurrent neural network (NN) 1304 is used to determine a predicted value 1312 of the high-order parameter based on the measured value 1308. The measured value 1308 of the high-order parameter can be used directly 1310 to determine the control recipe for processing of the measured lot.

The predicted value 1312 of the high-order parameter is determined based on the value 1308 of the high-order parameter obtained from measurements 1306 at a first operation L1 of a process step in the semiconductor manufacturing process to determine a control recipe 1314 of a subsequent operation L2 of the process step in the semiconductor manufacturing process. The predicted value is fed back 1324 into the recurrent neural network ($NN_{t=2}$). For exposure of lots L3 to L5, the recurrent neural network ($NN_{t=2\ldots5}$) updates itself to produce predicted values which are used to determine control recipes for successive lots. A subsequent value 626 of the high-order parameter is obtained based on measurements 628 using the dense sampling scheme. The recurrent neural network is updated ($NN_{t=6}$) using the subsequent value 626.

Meanwhile, a value 1318 of a low-order parameter is obtained based on measurements (for example value 1320 from measurements of lot at exposure step L2) using a spatially sparse sampling scheme. The sparse sampling scheme is less spatially dense and more frequent than the high-order sampling scheme used for measurements 1306, 1328. The value 1320 of the low-order parameter is used to determine the control recipe 1322 of the subsequent operation L2 of the exposure process step.

The value 1320 of the low-order parameter may be obtained based on measurements performed on the same substrate supported on the same substrate table at which the subsequent operation L2 of the process step is performed. The control recipe 1322 is determined using the value 1320 of the low-order parameter.

In this example, the semiconductor manufacturing process is a batch-wise process of patterning substrates. The sampling scheme for obtaining high-order parameters has a measurement frequency of per 5 (as shown in FIG. 13) to 10 batches. The second sampling scheme has a measurement frequency of one per batch.

In this example, the semiconductor manufacturing process is a process of patterning substrates using exposure fields. The sampling scheme for obtaining high-order parameters has a spatial density of 200 to 300 measurement points per field and the sampling scheme for obtaining low-order parameters has a spatial density of 2 to 3 measurement points per field.

The method of predicting a value of a parameter associated with the semiconductor manufacturing process, as described with reference to FIG. 6 may be implemented within a semiconductor manufacturing process. The method may be implemented in a lithographic apparatus with processing unit, such a LACU in FIG. 2. It may be implemented in a processor in the supervisory control system SCS of FIG. 2 or computer system CL of FIG. 3.

An embodiment of the invention may also be embodied as a computer program product comprising machine readable instructions for causing a general-purpose data processing apparatus to perform the steps of a method as described with reference to FIG. 13.

It is an advantage of the method of FIG. 13 that for overlay no additional measurement is required, compared to the method of FIG. 11. For alignment, only few wafers per lot are required to have spatially dense measurements, while all wafers receive different control recipes determined based on different high-order parameters. The in-between lots (for overlay) or wafers (for alignment) receive updated control recipes determined with high-order parameters predicted by the LSTM. Wafer table (chuck) matching is not required because the low-order measurements and corresponding control recipe update are performed on the same wafer table, for overlay and alignment parameters.

Figure 14:
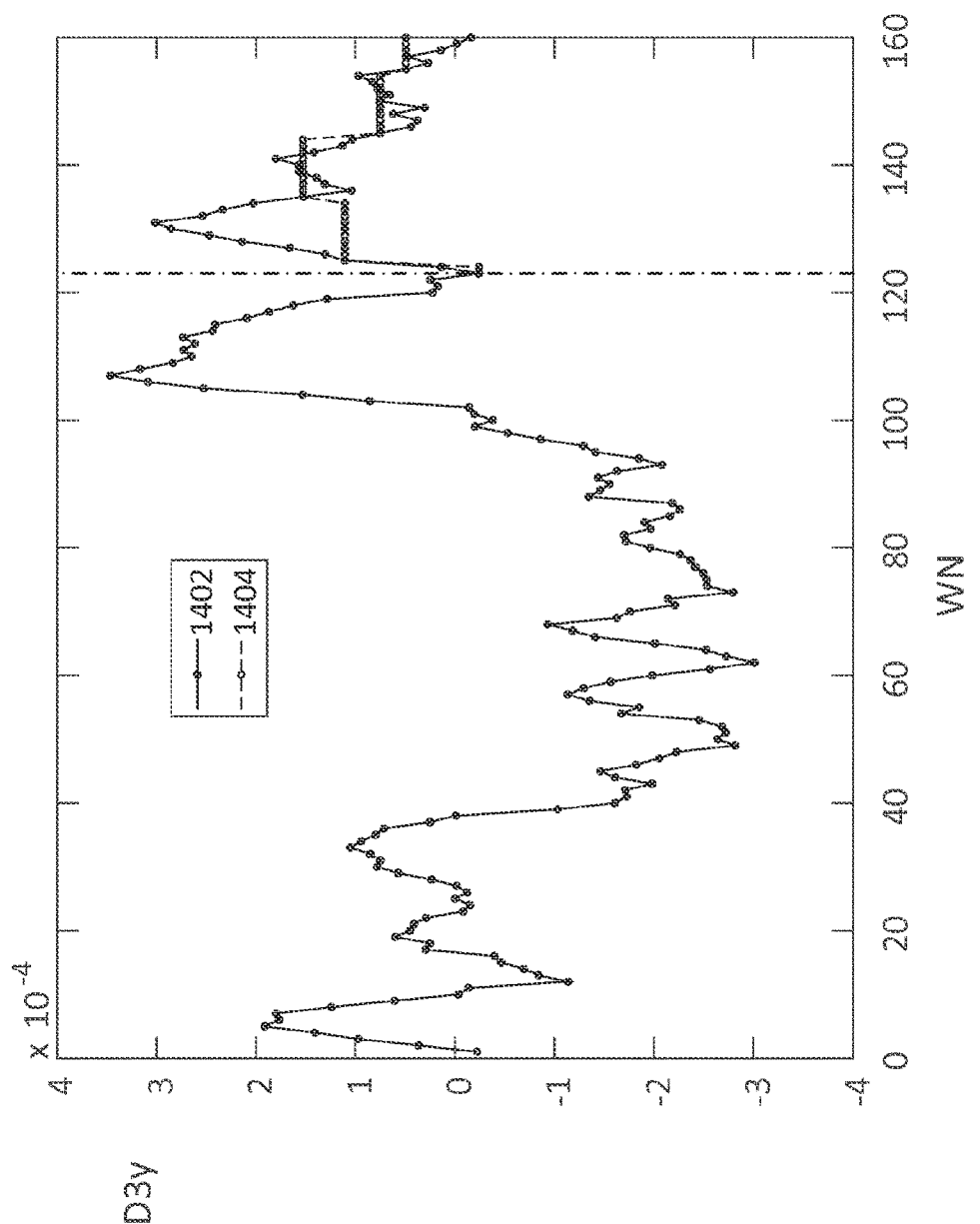
FIG. 14 is a graph of an overlay higher-order parameter update corresponding to the sampling and control scheme of FIG. 11.
Figure 15:
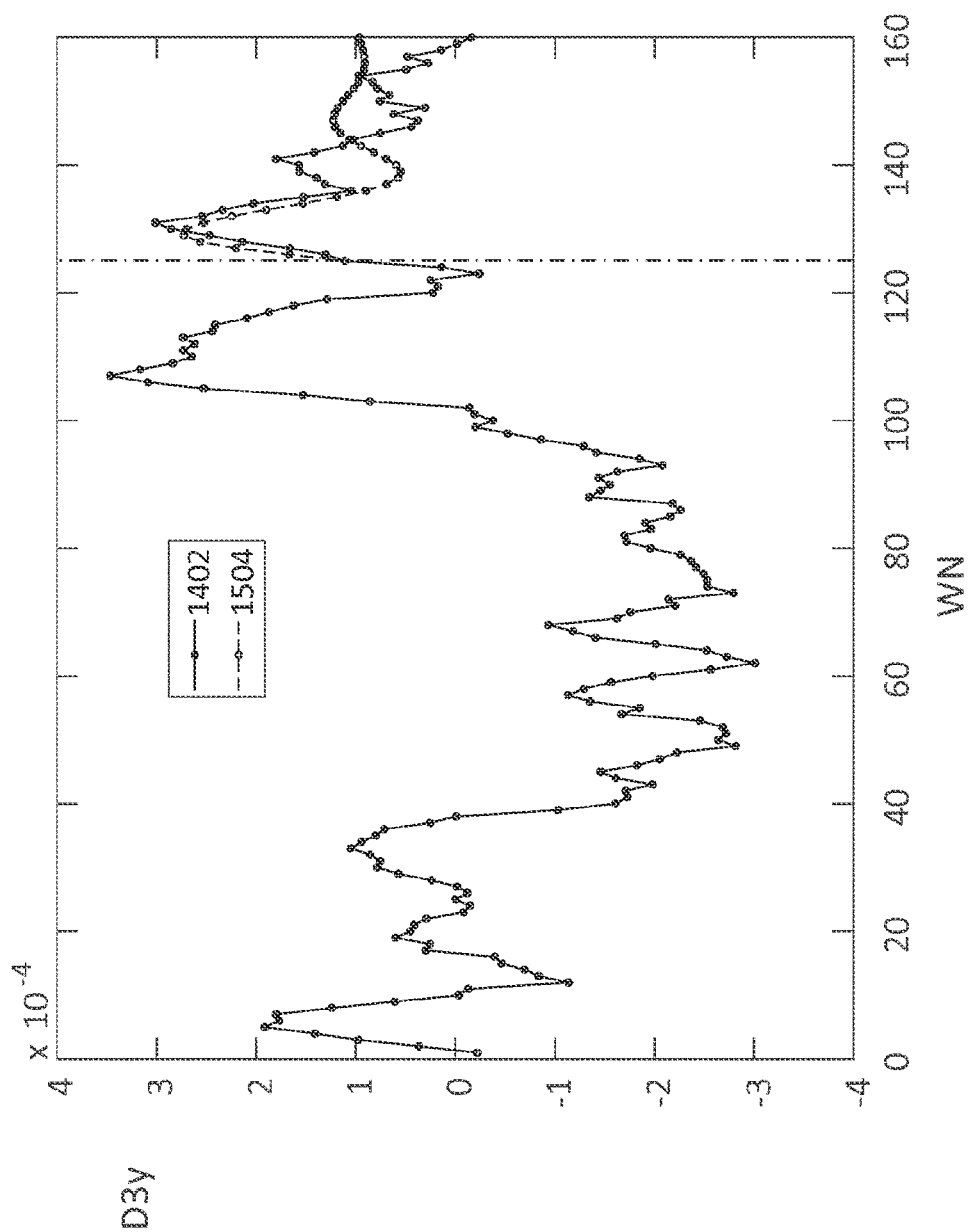
FIG. 15 is a graph of an overlay higher-order parameter update with no updates in accordance with an embodiment of the present invention.
Figure 16:
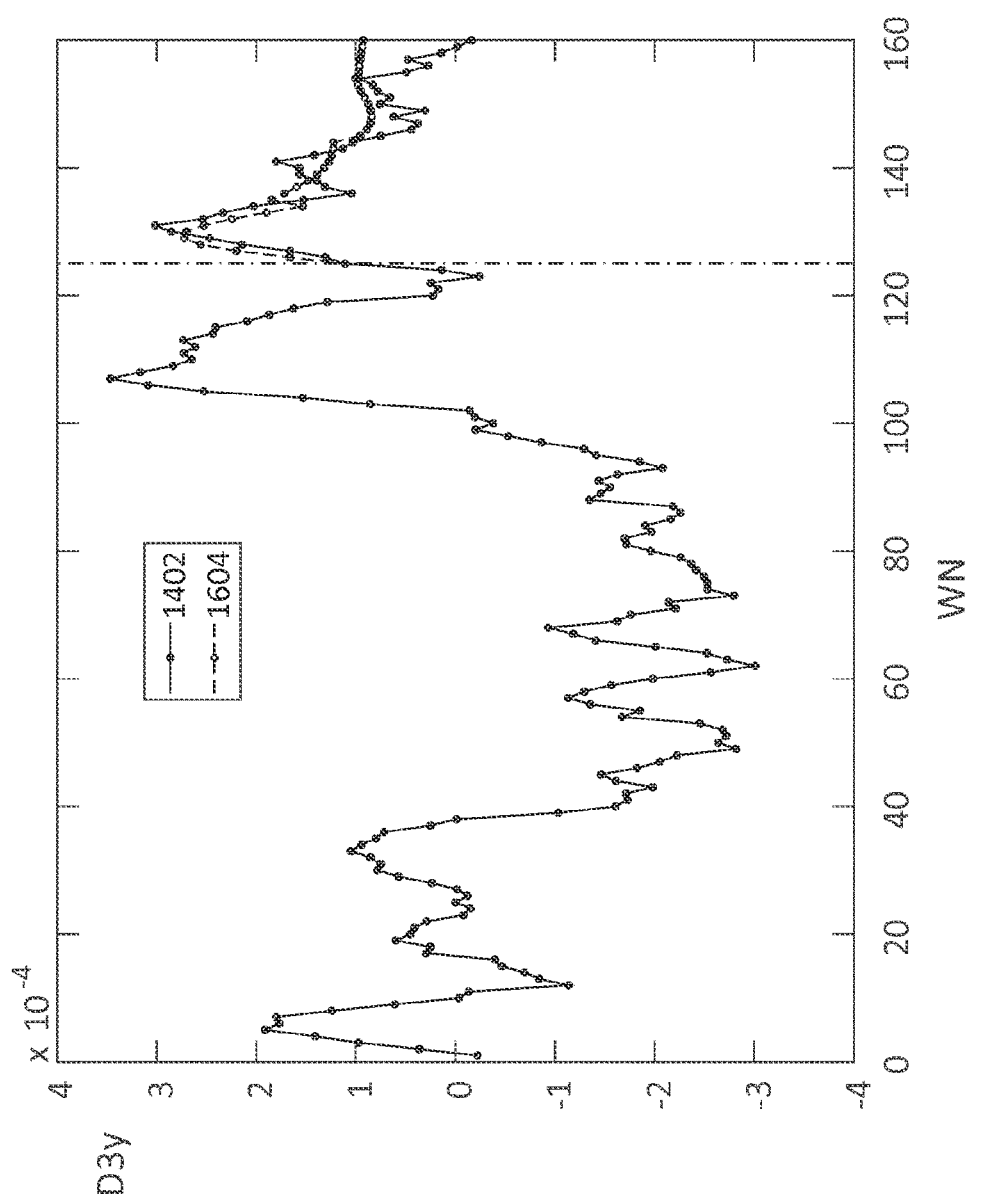
FIG. 16 is a graph of an overlay higher-order parameter update with updates corresponding to the sampling and control scheme of FIG. 13 in accordance with an embodiment of the present invention.

FIG. 14 is a graph of an overlay higher-order parameter update corresponding to the sampling and control scheme of FIG. 11. In FIGS. 14 to 16, the horizontal axis is wafer number WN. The vertical axis is the third-order scanner exposure magnification parameter in the y-direction D3y. In FIGS. 14 to 16, the solid line graph 1402 is the original value of the high-order parameter from dense measurement sampling.

With reference to FIG. 14, the dashed line graph 1404, to the right of the vertical dot-dash line is the higher-order parameter update with the parameter being updated every 10 points (note that FIG. 11 shows this update every 5 points).

FIG. 15 is a graph of an overlay higher-order parameter update with no updates in accordance with an embodiment of the present invention.

With reference to FIG. 15, the dashed line graph 1504, to the right of the vertical dot-dash line is the predicted parameter value with no updates. This would correspond to FIG. 13, but without an update at L6 or subsequently. Thus it uses a free LSTM, with no updates after training.

FIG. 16 is a graph of an overlay higher-order parameter update with updates corresponding to the sampling and control scheme of FIG. 13 in accordance with an embodiment of the present invention.

With reference to FIG. 16, the dashed line graph 1604, to the right of the vertical dot-dash line is the predicted parameter value with updates every 10 points (note that FIG. 13 shows this update every 5 points). The LSTM network is trained with 78% of the data, to the left of the vertical dot-dash line. The LSTM network is validated on the rest (22%-35 wafers, dashed line 904). The root mean square error (RMSE) between original and predicted D3y is best for FIG. 16 (RMSE=2.12e−05), while FIG. 15 (RMSE=2.83e−05) and FIG. 14 (RMSE=2.82e−05) are comparable.

Figure 17:
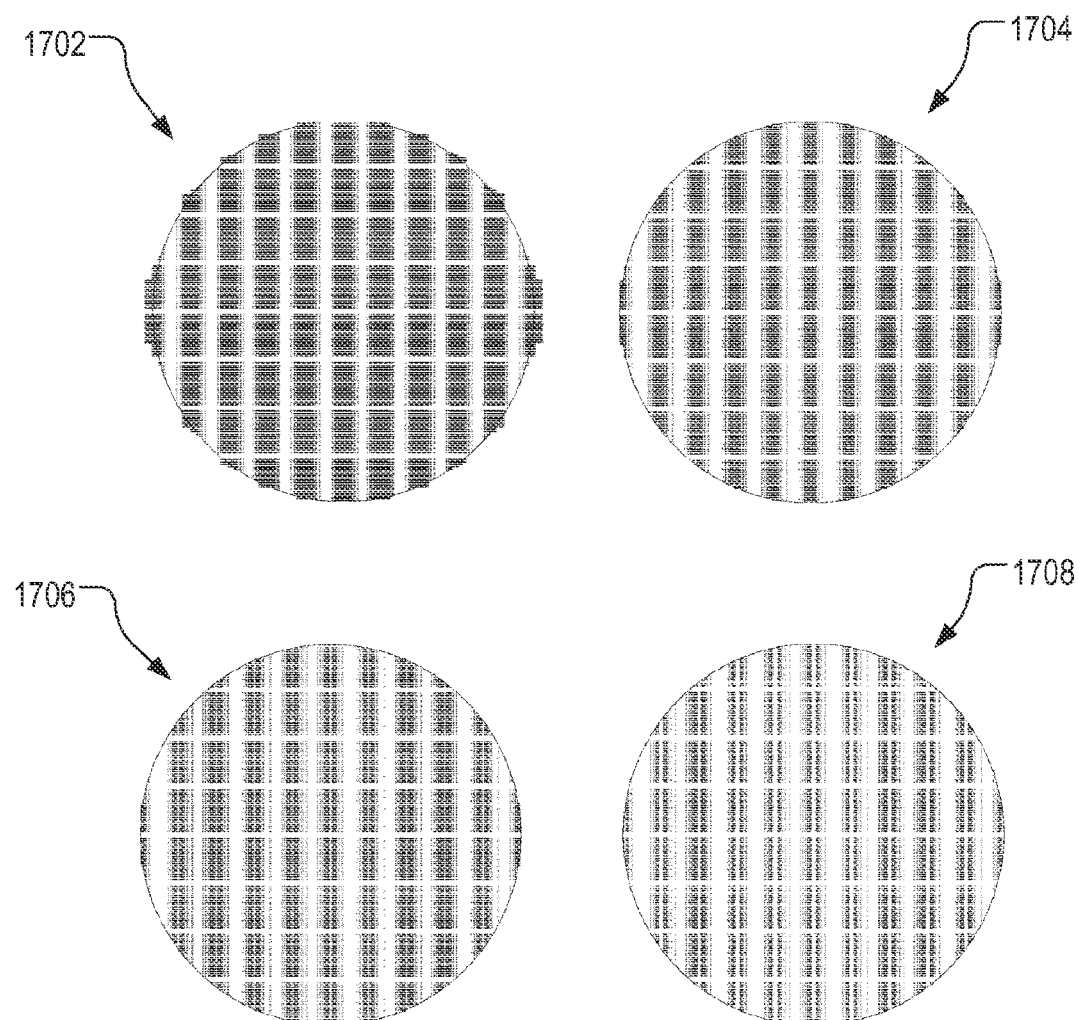
FIG. 17 depicts wafer maps of measured overlay with no high-order overlay parameter correction, with overlay higher-order parameter update corresponding to FIG. 14, and with overlay parameter prediction corresponding to FIGS. 15 and 16.

FIG. 17 depicts wafer maps of measured overlay with no high-order overlay parameter correction, with overlay higher-order parameter update corresponding to FIG. 14, and with overlay parameter prediction corresponding to FIGS. 15 and 16.

In the wafer plots the real corrections are applied on dense (13*19 points per field) layout and the correction capability for each case is compared. The plots show mean plus 3 sigma overlay. A darker pattern represents worse overlay performance. A baseline wafer map 1702 is shown with no high-order correction. The wafer map 1704 results from overlay higher-order parameter update corresponding to the plot of FIG. 14, for conventional overlay. The wafer map 1706 results from overlay higher-order parameter update corresponding to the plot of FIG. 15, for a free LSTM with no updates. The wafer map 1708 results from overlay higher-order parameter update corresponding to the plot of FIG. 16, which is for LSTM prediction with updates. The latter has the best overlay correction performance, shown by the lighter pattern.

Embodiments provide a way to include high-order parameters into alignment correction without measuring each wafer. Embodiments also improve the methodology for updating overlay measurements.

Alternatively, or in addition, to using the method to update (higher-order) parameters the methods may be used to update parameters of a model used to update said parameters. For example run-to-run control of a semiconductor manufacturing process typically is based on determination of process corrections using periodically measured process (related) parameters. To prevent too large fluctuations of the process corrections often an Exponentially Weighted Moving Average (EWMA) scheme is applied to a set of historic process parameter measurement data, the set including more than just the last obtained measurements of the process parameter. The EWMA scheme may have a set of associated weighting parameters, one of them is the so-called "smoothing constant" $\lambda$. The smoothing constant dictates the extent to which measured process parameter values are used for future process corrections, or alternatively said; how far back in time measured process parameter values are used to determine current process corrections. The EWMA scheme may be represented by: $Z_i = \lambda \cdot X_i + (1-\lambda) \cdot Z_{i-1}$, wherein $Z_{i-1}$ may for example represent a process parameter value previously determined as to be most suitable to correct run (typically a lot of substrates) 'i-1', Xi is the process parameter as measured for run 'i', and then Zi is predicted to represent a value of the process parameter to be most suitable to correct run T (the run subsequent to run 'i-1').

More information on the use of EWMA in process control is provided for example in "Automated Process Control optimization to control Low Volume Products based on High Volume Products data, Proceedings of SPIE 5755, 17 May 2005, doi: 10.1117/12.598409", which is hereby included by reference in its entirety.

The value taken for the smoothing constant directly influences the predicted best process parameter used for determining process corrections for run T. However process fluctuations may occur which may affect the optimal value of the smoothing constant (or any other parameter associated with a model for weighting historic process parameter data).

It is proposed to use the recurrent neural network or LSTM as described in previous embodiments to predict one or more values of a first parameter associated with a semiconductor manufacturing process based on historic measurement values of the first parameter. Instead of, or in addition to, determining a control recipe of a subsequent operation of a process step in the semiconductor manufacturing process it is proposed to update one or more parameters associated with the weighting model based on the predicted values of the first parameter. Said one more parameters may include the smoothing constant. The smoothing constant for example may be determined based on the level of agreement between the predicted values of the first parameter using the recurrent neural network (e.g. typically the LSTM) and values of the first parameter predicted using the weighting model (e.g. typically an EWMA based model). The weighting parameter (e.g. typically the smoothing constant) giving best agreement is selected. Periodic re-evaluation of the quality of the smoothing constant when benchmarked to LSTM based prediction ensures optimal configuration of the EWMA model at any point in time.

In an embodiment a method for predicting a value of a first parameter associated with a semiconductor manufacturing process is disclosed, the method comprising: obtaining a first value of the first parameter based on measurements using a first sampling scheme; using a recurrent neural network to determine a predicted value of the first parameter based on the first value; determining a value of a parameter associated with a model used by a controller of a semiconductor manufacturing process based on the predicted value of the first parameter and the obtained first value of the first parameter.

In an embodiment the determining of the previous embodiment is based on comparing the predicted value of the first parameter with a value of the first parameter obtained by application of the model to the obtained first value of the first parameter.

In an embodiment the model is an Exponentially Weighted Moving Averaging model and the parameter is a smoothing constant associated with said Exponentially Weighted Moving Averaging model.

Further embodiments of an aspect of the invention are disclosed in the list of numbered clauses below:

23. A method for predicting a value of a first parameter associated with a semiconductor manufacturing process, the method comprising:
    obtaining a first value of the first parameter based on measurements using a first sampling scheme; and
    using a recurrent neural network to determine a predicted value of the first parameter based on the first value.

24. The method of clause 23, further comprising using the predicted value of the first parameter determined based on the first value obtained from measurements at a first operation of a process step in the semiconductor manufacturing process to determine a control recipe of a subsequent operation of the process step in the semiconductor manufacturing process.

25. The method of clause 24, further comprising:
    obtaining a second value of a second parameter based on measurements using a second sampling scheme being less spatially dense and more frequent than the first sampling scheme; and
    using the second value of the second parameter to determine the control recipe of the subsequent operation of the process step.

26. The method of clause 25, wherein the second value is obtained based on measurements at the subsequent operation of the process step.

27. The method of clause 26, wherein the second value is obtained based on measurements performed on the same substrate supported on the same substrate table at which the subsequent operation of the process step is performed with the control recipe determined using the second value.

28. The method of any of clauses 25 to 27, wherein the semiconductor manufacturing process is a batch-wise process of patterning substrates, and wherein the first sampling scheme has a measurement frequency of per 5 to 10 batches and the second sampling scheme has a measurement frequency of one per batch.

29. The method of any of clauses 25 to 28, wherein the semiconductor manufacturing process is a process of patterning substrates using exposure fields, and wherein the first sampling scheme has a spatial density of 200 to 300 measurement points per field and the second sampling scheme has a spatial density of 2 to 3 measurement points per field.

30. The method of any of clauses 23 to 29, further comprising obtaining a subsequent value of the first parameter based on measurements using the first sampling scheme and updating the recurrent neural network using the subsequent value.

31. The method of any of clauses 23 to 30, wherein the parameter comprises an exposure magnification parameter and the process step comprises lithographic exposure.

32. The method of any of clauses 23 to 31, wherein the recurrent neural network comprises a Long Short-Term Memory network.

33. A semiconductor manufacturing process comprising a method for predicting a value of a parameter associated with the semiconductor manufacturing process according to the method of any of clauses 23 to 32.

34. A lithographic apparatus comprising:
    an illumination system configured to provide a projection beam of radiation;
    a support structure configured to support a patterning device, the patterning device configured to pattern the projection beam according to a desired pattern;
    a substrate table configured to hold a substrate;
    a projection system configured the project the patterned beam onto a target portion of the substrate; and
    a processing unit configured to:
        predict a value of a parameter associated with the semiconductor manufacturing process according to the method of any of clauses 23 to 32.

35. A computer program product comprising machine readable instructions for causing a general-purpose data processing apparatus to perform the steps of a method according to any of clauses 23 to 32.

36. The method of any of clauses 23 to 32, further comprising determining a value of a parameter associated with a model used by a controller of a semiconductor manufacturing process based on the predicted value of the first parameter and the obtained first value of the first parameter based on measurements using a first sampling scheme.

37. The method of clause 36, wherein the determining is based on comparing the predicted value of the first parameter with a value of the first parameter obtained by application of the model to the obtained first value of the first parameter.

38. The method of clause 36 or clause 37, wherein the model is an Exponentially Weighted Moving Averaging model and the parameter is a smoothing constant associated with said Exponentially Weighted Moving Averaging model.

39. A method for configuring a semiconductor manufacturing process, the method comprising:
    obtaining a first value of a first parameter based on measurements associated with a first operation of a process step in the semiconductor manufacturing process and a first sampling scheme;
    using a recurrent neural network to determine a predicted value of the first parameter based on the first value; and
    using the predicted value of the first parameter in configuring a subsequent operation of the process step in the semiconductor manufacturing process.

40. The method of clause 39, further comprising:
    obtaining a second value of a second parameter based on measurements using a second sampling scheme being spatially less dense than the first sampling scheme; and
    using the second value of the second parameter in configuring the subsequent operation of the process step in the semiconductor manufacturing process.

41. The method of clause 40, wherein the second value is obtained based on measurements at the subsequent operation of the process step.

42. The method of clause 41, wherein the second value is obtained based on measurements performed on the same substrate supported on the same substrate table at which the subsequent operation of the process step is performed with the subsequent operation of the process step being configured using the second value.

43. The method of clause 40, wherein the semiconductor manufacturing process is a batch-wise process of patterning substrates, and wherein the first sampling scheme has a measurement frequency of per 5 to 10 batches and the second sampling scheme has a measurement frequency of one per batch.

44. The method of clause 40, wherein the semiconductor manufacturing process is a process of patterning substrates using exposure fields, and wherein the first sampling scheme has a spatial density of 200 to 300 measurement points per exposure field and the second sampling scheme has a spatial density of 2 to 3 measurement points per exposure field.

45. The method of clause 39, further comprising obtaining a subsequent value of the first parameter based on measurements using the first sampling scheme and updating the recurrent neural network using the subsequent value.

46. The method of clause 39, wherein the parameter comprises an exposure magnification parameter and the process step comprises lithographic exposure.

47. The method of clause 39, wherein the recurrent neural network comprises a Long Short-Term Memory network.

48. A semiconductor manufacturing process comprising a method for configuring a semiconductor manufacturing process according to the method of clause 39.

49. The method of clause 39, further comprising determining a value of a parameter associated with a model used by a controller of a semiconductor manufacturing process based on the predicted value of the first parameter and the obtained first value of the first parameter based on measurements using the first sampling scheme.

50. The method of clause 49, wherein the determining is based on comparing the predicted value of the first parameter with a value of the first parameter obtained by application of the model to the obtained first value of the first parameter.

51. The method of clause 49, wherein the model is an Exponentially Weighted Moving Averaging model and the parameter is a smoothing constant associated with said Exponentially Weighted Moving Averaging model.

52. A computer program product comprising machine readable instructions for causing a general-purpose data processing apparatus to perform the steps of a method as claimed in clause 39.

53. A lithographic apparatus comprising:
    an illumination system configured to provide a projection beam of radiation;
    a support structure configured to support a patterning device, the patterning device configured to pattern the projection beam according to a desired pattern;
    a substrate table configured to hold a substrate;
    a projection system configured the project the patterned beam onto a target portion of the substrate; and a processing unit configured to configure the semiconductor manufacturing process according to the method of clause 39.

General Definitions

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). It is also to be noted that the term metrology apparatus or metrology system encompasses or may be substituted with the term inspection apparatus or inspection system. A metrology or inspection apparatus as disclosed herein may be used to detect defects on or within a substrate and/or defects of structures on a substrate. In such an embodiment, a characteristic of the structure on the substrate may relate to defects in the structure, the absence of a specific part of the structure, or the presence of an unwanted structure on the substrate, for example.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of physical systems such as structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of a physical structure may relate to defects in the structure, the absence of a specific part of the structure, or the presence of an unwanted structure on the substrate or on the wafer.

Although specific reference may have been made above to the use of embodiments of the invention in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. With respect to the multi-sensitivity target embodiment, the different product features may comprise many regions with varying sensitivities (varying pitch etc.). Further, pitch p of the metrology targets is close to the resolution limit of the optical system of the scatterometer, but may be much larger than the dimension of typical product features made by lithographic process in the target portions C. In practice the lines and/or spaces of the overlay gratings within the target structures may be made to include smaller structures similar in dimension to the product features.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A method comprising:
   obtaining a set of values of a parameter associated with a plurality of positions on a substrate;
   obtaining a first matrix of values based on evaluation of one or more base functions at the plurality of positions;
   obtaining a second matrix of values based on training, by a hardware computer, a matrix of adaptable numbers to previously obtained sets of values of the parameter associated with previous substrates;
   using the first matrix and second matrix of values and the obtained sets of values of the parameter to determine coefficients of a model; and
   using the coefficients and second matrix of values to provide modeled values of the parameter.

2. The method according to claim 1, wherein the parameter is overlay.

3. The method according to claim 1, wherein the plurality of positions is associated with a sparse measurement scheme across one or more substrates being subject to a semiconductor manufacturing process.

4. The method according to claim 1, wherein the base functions are polynomials.

5. The method according to claim 1, wherein the base functions are mutually orthogonal.

6. The method according to claim 1, wherein the plurality of positions relate to an exposure field on the substrate.

7. The method according to claim 1, wherein the adaptable numbers are freeform model parameters.

8. The method according to claim 1, wherein the previously obtained sets of values of the parameter are associated with densely measured previous substrates.

9. The method according to claim 1, wherein the training is based on using a machine learning model to establish relations between the adaptable numbers and a fingerprint of the parameter across each individual substrate out of the previous substrates.

10. The method according to claim 9, wherein the machine learning model is based on a neural network.

11. A method comprising:
    obtaining a first set of measured values of a patterning process parameter associated with a plurality of positions on a substrate; and
    using, by a hardware computer system, the first set of measured values as an input to a machine learning model trained to map one or more measured values of the parameter to one or more predicted values of the parameter to obtain a second set of modeled values of the parameter.

12. The method according to claim 11, wherein the machine learning model is a neural network.

13. The method according to claim 11, wherein the machine learning model is trained to optimize the similarity between the one or more measured values of the parameter and the one or more predicted values of the parameter.

14. A computer program product comprising a non-transitory computer-readable medium comprising instructions therein, the instructions, upon execution by a computer system, configured to cause the computer system to at least:
- obtain a set of values of a parameter associated with a plurality of positions on a substrate;
- obtain a first matrix of values based on evaluation of one or more base functions at the plurality of positions;
- obtain a second matrix of values based on training a matrix of adaptable numbers to previously obtained sets of values of the parameter associated with previous substrates;
- use the first matrix and second matrix of values and the obtained sets of values of the parameter to determine coefficients of a model; and
- use the coefficients and second matrix of values to provide modeled values of the parameter.

15. The computer program product of claim 14, wherein the base functions are polynomials.

16. The computer program product of claim 14, wherein the adaptable numbers are freeform model parameters.

17. The computer program product of claim 14, wherein the machine learning model is based on a neural network.

18. A computer program product comprising a non-transitory computer-readable medium comprising instructions therein, the instructions, upon execution by a computer system, configured to cause the computer system to at least:
- obtain a first set of measured values of a patterning process parameter associated with a plurality of positions on a substrate; and
- use the first set of measured values as an input to a machine learning model trained to map one or more measured values of the parameter to one or more predicted values of the parameter to obtain a second set of modeled values of the parameter.

19. The computer program product of claim 18, wherein the machine learning model is a neural network.

20. The computer program product of claim 18, wherein the machine learning model is trained to optimize the similarity between the one or more measured values of the parameter and the one or more predicted values of the parameter.

* * * * *